United States Patent
Rotithor et al.

(10) Patent No.: US 7,386,658 B2
(45) Date of Patent: Jun. 10, 2008

(54) MEMORY POST-WRITE PAGE CLOSING APPARATUS AND METHOD

(75) Inventors: Hemant G. Rotithor, Hillsboro, OR (US); Randy B. Osborne, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 339 days.

(21) Appl. No.: 10/877,356

(22) Filed: Jun. 25, 2004

(65) Prior Publication Data

US 2005/0204094 A1 Sep. 15, 2005

Related U.S. Application Data

(63) Continuation-in-part of application No. 10/801,201, filed on Mar. 15, 2004, now Pat. No. 7,167,947.

(51) Int. Cl.
G06F 12/00 (2006.01)
(52) U.S. Cl. .................. 711/108; 711/128
(58) Field of Classification Search ............ None
See application file for complete search history.

(56) References Cited

U.S. PATENT DOCUMENTS

| | | | |
|---|---|---|---|
| 5,440,715 A * | 8/1995 | Wyland | 711/108 |
| 5,889,714 A * | 3/1999 | Schumann et al. | 365/203 |
| 6,505,260 B2 * | 1/2003 | Chin et al. | 710/41 |
| 6,564,301 B1 * | 5/2003 | Middleton | 711/144 |
| 6,591,349 B1 | 7/2003 | Steinman et al. | |
| 6,631,440 B2 * | 10/2003 | Jenne et al. | 711/105 |
| 7,002,824 B2 * | 2/2006 | McKenzie et al. | 365/49 |
| 2003/0005216 A1 * | 1/2003 | Saruwatari et al. | 711/105 |
| 2003/0110350 A1 | 6/2003 | McGee et al. | |
| 2004/0123036 A1 * | 6/2004 | Hammitt et al. | 711/131 |
| 2004/0128455 A1 * | 7/2004 | Regev | 711/158 |
| 2005/0193166 A1 * | 9/2005 | Johnson et al. | 711/114 |

* cited by examiner

Primary Examiner—Reginald Bragdon
Assistant Examiner—Ngoc Dinh
(74) Attorney, Agent, or Firm—Blakely, Sokoloff, Taylor & Zafman LLP

(57) ABSTRACT

Apparatus and method to receive new requests for write transactions; compare rank, bank and page of new requests to those already stored and assemble chains of write commands directed to the same rank, bank and page; select and transmit write commands from one chain at a time until each chain is done; and select a next chain of write commands to transmit, while creating and using a write page closing hint to determine when a change between pages of a given rank and bank should bring about the preemptive closing of a page to minimize incidents of incurring lengthy page miss delays.

5 Claims, 15 Drawing Sheets

MEMORY POST-WRITE PAGE CLOSING APPARATUS AND METHOD

RELATED APPLICATIONS

This application is a continuation-in-part of U.S. patent application Ser. No. 10/801,201, now U.S. Pat. No. 7,167,947, filed on Mar. 15, 2004.

BACKGROUND

Dynamic random access memory (DRAM) devices provide the benefits of higher storage densities and less power consumption in comparison to other memory technologies, including and most notably, static random access memory (SRAM) devices. However, these benefits come at the cost of incurring various delays in accessing the memory cells making up a DRAM device, both at regular intervals, and in the time periods immediately before and after each access to either read data from the memory cells or to write data to the memory cells. The effect of these various delays has been to slow down the effective rate at which data stored within DRAM devices may be accessed, and although various ways have been devised in the prior art to mitigate the effect of these delays such that it is sometimes possible to entirely counteract certain delays in certain situations, the effect of these delays continues to be felt to a significant degree.

Common DRAM devices are made up of many memory cells organized into multiple banks of memory cells, with the memory cells inside of each bank being organized into an array of rows and columns. For data to be written to or read from one or more memory cells within a given row of a given bank, requires that the given row (also commonly referred to as a "page") within the given bank be "opened" for access with a row activate command and a delay be incurred to allow the row activation to complete before the actual reading or writing of data can take place. Unfortunately, only one row of any bank may be open at a time, and if a row other than the given row is already open in the given bank, then that other row must be "closed" with a precharge command and a delay be incurred to allow the precharge to complete before the row activate command to open the given row can be transmitted.

The delay incurred to allow a precharge to finish closing one row before another can be opened in the same bank is a significant delay, and various schemes have been devised to attempt to counteract this delay.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Embodiments of the present invention concern incorporating support for marking write transactions with a page closing hint to cause a given write transaction to a given page to be immediately followed with a precharge to close the given page. Although the following discussion centers on DRAM devices in which memory cells are organized into one or more two dimensional arrays of rows and columns, it will be understood by those skilled in the art that the invention as hereinafter claimed may be practiced in support of a number of different types of memory devices having memory cells organized in a number of different possible ways, including interleaved banks, arrays of more than two dimensions (i.e., more than two-part addresses), content-addressable, etc. Also, although at least part of the following discussion centers on memory devices within computer systems, it will be understood by those skilled in the art that the invention as hereinafter claimed may be practiced in connection with other electronic devices having memory devices.

Figure 1:
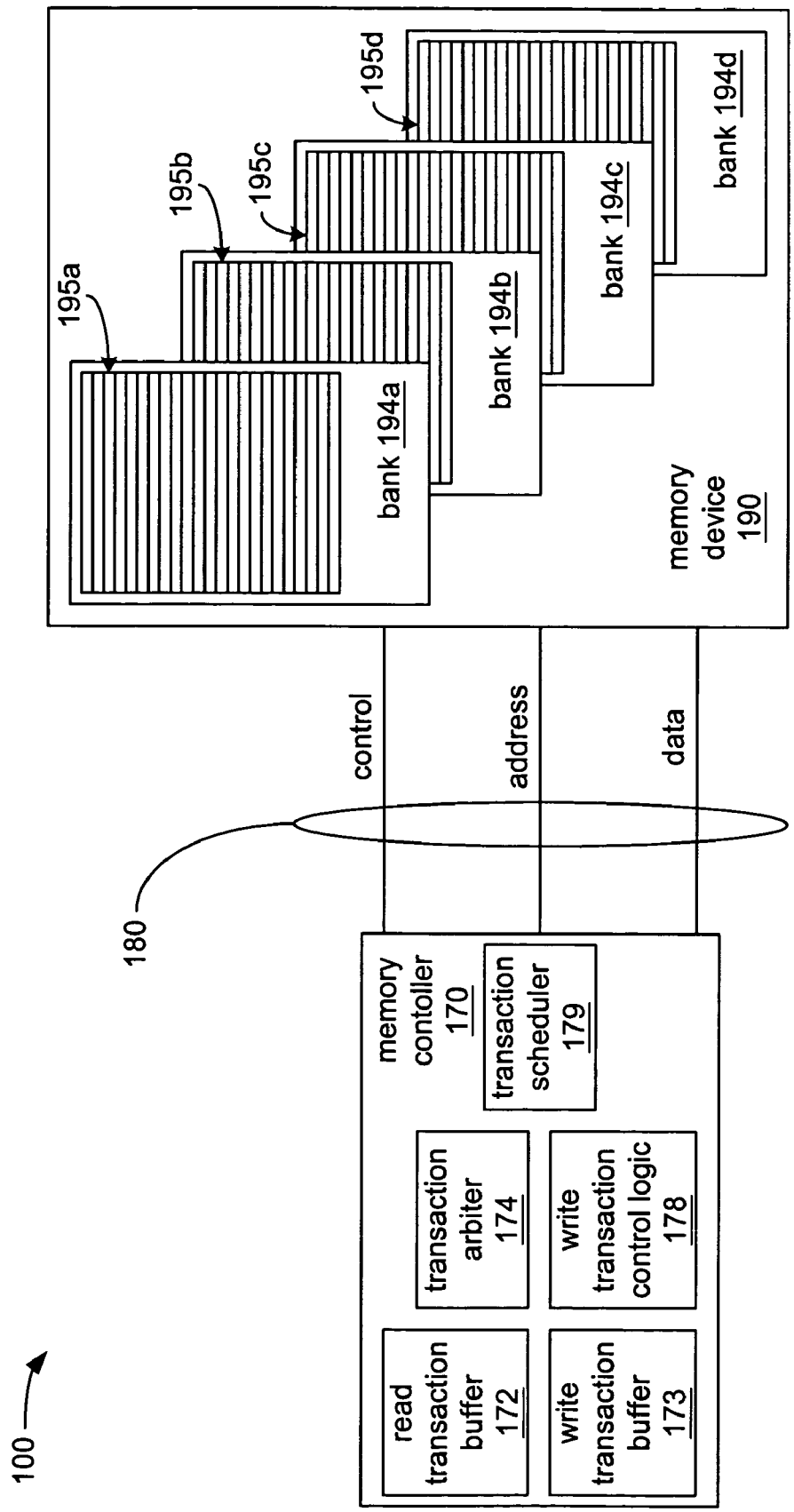
FIG. 1 is a block diagram of an embodiment employing a memory system having a memory controller.

FIG. 1 is a simplified block diagram of an embodiment employing a memory system. Memory system 100 is made up, at least in part, of memory controller 170 and memory device 190 coupled together via memory bus 180. Those skilled in the art of the design of memory systems will readily recognize that FIG. 1 depicts one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 100 is depicted as having only one memory bus 180 and only one memory device 190 for the sake of simplicity in the discussion that follows, it will be readily understood by those skilled in the art that other possible embodiments of memory system 100 may be made up of multiple memory buses and/or devices.

Memory controller 170 controls the functions carried out by memory device 190 as part of providing access to memory device 190 to external devices (not shown) coupled to memory controller 170. Specifically, an external device coupled to memory controller 170 issues commands to memory controller 170 to store data within memory device 190, and to retrieve stored data from memory device 190. Memory controller 170 receives these commands and relays them to memory device 190 in a format having timing and protocols compatible with memory bus 180. In effect, memory controller 170 coordinates accesses made to memory cells within memory device 190 in answer to read and write commands from external devices. In support of these functions in various embodiments, memory controller 170 also coordinates various maintenance operations that must be performed to ensure that data stored within memory device 190 is preserved, including the initiation of regular refresh operations and the occurrence of precharge operations as needed between accesses.

Memory bus 180 is made up of various control, address and data signal lines coupling together memory controller 170 and memory device 190. The exact quantity and characteristics of the various signal lines making up various possible embodiments of memory bus 180 may be configured to be interoperable with any of a number of possible memory interfaces, including those meant to be compatible with known types of memory devices, among them being DRAM (dynamic random access memory) devices such as FPM (fast page mode) memory devices, EDO (extended data out), dual-port VRAM (video random access memory), window RAM, SDR (single data rate), DDR (double data rate), RAMBUS™ DRAM, etc. In some embodiments, where activity on various signal lines is meant to be coordinated with a clock signal, one or more of the signal lines, perhaps the control signal lines, serves to transmit a clock signal between memory controller 170 and memory device 190. In some embodiments, one or more control signals and address signals may be multiplexed onto common signal lines such that control signals and address signals are transmitted at different times on common conductors for carrying signals between memory controller 170 and memory device 190. Also, in some embodiments, one or more address signals and data signals may be multiplexed onto common signal lines.

Memory device 190 is a DRAM memory device configured to be interoperable with memory bus 180. In some embodiments, memory device 190 is a single integrated circuit. In other embodiments, memory device 190 is made up of multiple integrated circuits of a removable memory module, such as a SIMM (single inline memory module), SIPP (single inline pin package), DIMM (dual inline memory module), etc. The memory cells of memory device 190 are grouped into multiple banks, such as banks 194*a-d*, with the memory cells of each bank being subdivided into pages 195*a-d* (also commonly referred to as "rows"), respectively. Memory device 190 receives commands and addresses from memory controller 170 through memory bus 180, and carries out those commands, accessing one or more specific ones of pages 195*a-d* of one or more corresponding ones of banks 194*a-d*. Although memory device 190 is depicted as having only one rank of banks (namely banks 194*a-d*), it will be understood by those skilled in the art that memory device 190 may be made up of multiple ranks selectable via chip select signals in a manner akin to there being multiple memory devices, or selectable via other signaling techniques or protocols.

In some embodiments, memory controller 170 is made up of read transaction buffer 172, write transaction buffer 173, transaction arbiter 174, write transaction control logic 178 and transaction scheduler 179. As memory controller 170 receives requests to either read data from memory device 190 or to write data to memory device 190, requests for read and write transactions are separately stored in read transaction buffer 172 and write transaction buffer 173, respectively (although requests for read and write transactions may be stored in a combined buffer in alternate embodiments). Transaction arbiter 174 monitors read transaction buffer 172 and write transaction buffer 173 to determine whether a pending read transaction or a pending write transaction should next be executed, with any of a number of possible algorithms being employed to make such a determination. In some embodiments, various factors may lead to the choice of an algorithm in which read transactions are always given priority over write transactions and/or an algorithm for determining which write transactions are accompanied with a page closing hint without taking into account either characteristics or status of pending read transactions. Such factors may include the disjunctular nature of pending read and write transactions in various electronic systems such that a read transaction pending at any given time may not be likely to overlap the same address or even the same page of a bank as a write transaction pending at the same time, the possible high sensitivity of the performance of read transactions to the latency of awaiting the return of read data, and the simple fact that pending write transactions are being stored in a buffer, such as write transaction buffer 173.

Regardless of the algorithm employed by transaction arbiter 174, in some embodiments, when transaction arbiter 174 chooses to allow a write transaction to be carried out, memory controller 170 engages in a multi-step process to select a write transaction from among pending write transactions stored in write transaction buffer 173 in a manner intended to minimize back-to-back write page misses, and write transaction control logic 178 marks certain write transactions that are selected and passed on to transaction scheduler 179 with a page closing hint signal to attempt to minimize occurrences of pages being left open such that a write page miss occurs. These approaches to minimizing back-to-back write page misses and marking certain write pages with page closing hints will be discussed in greater detail, below. The marking of given write transactions selected from write transaction buffer 173 may, in some embodiments, result in a write command with auto precharge being transmitted by transaction scheduler to memory device 190 so that the page to which the write command is directed is closed immediately after being written, as opposed to transmitting a write command that does not embed an auto precharge command.

Figure 2:
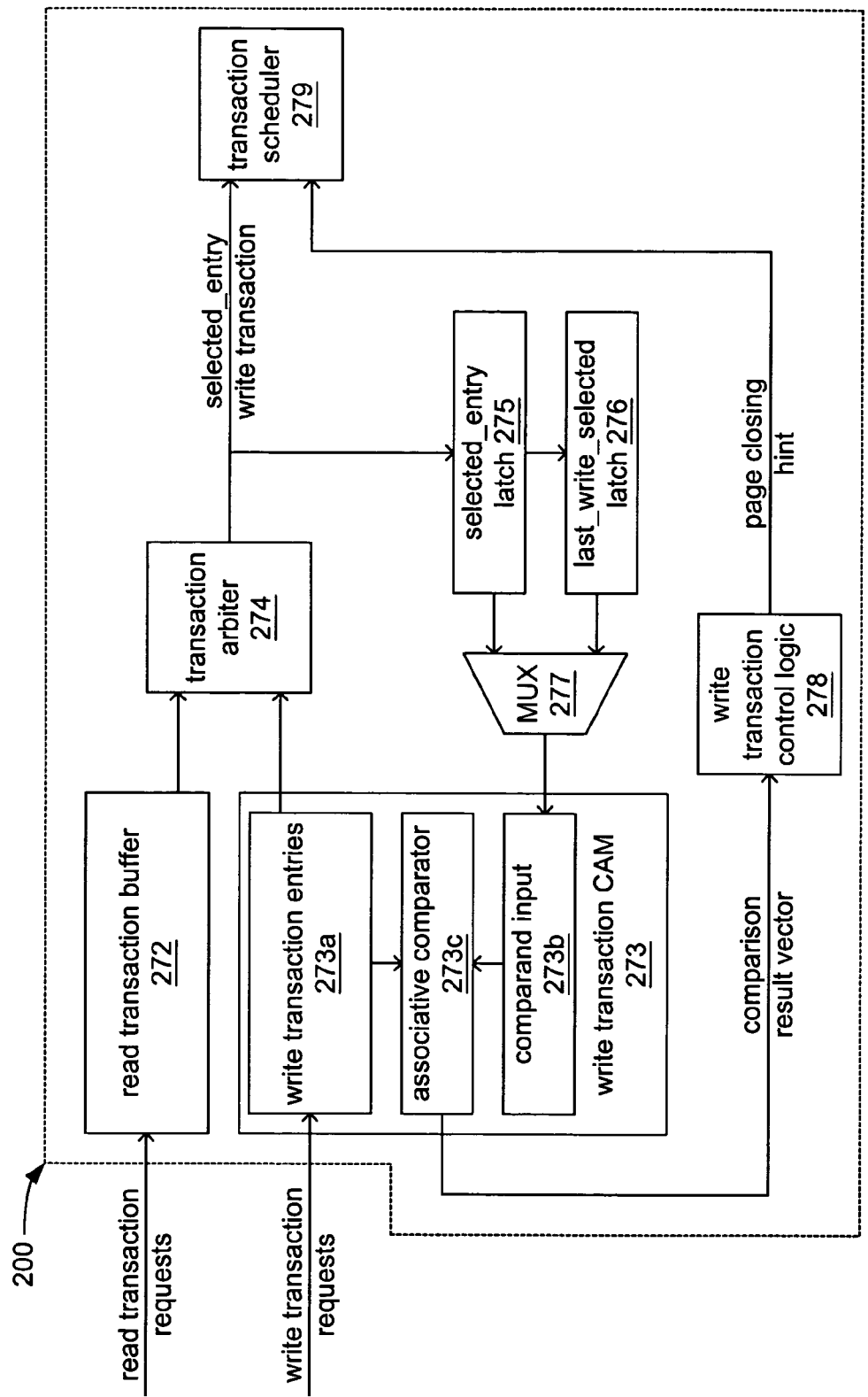
FIG. 2 is a block diagram of an embodiment employing memory control circuitry.
Figure 3A:
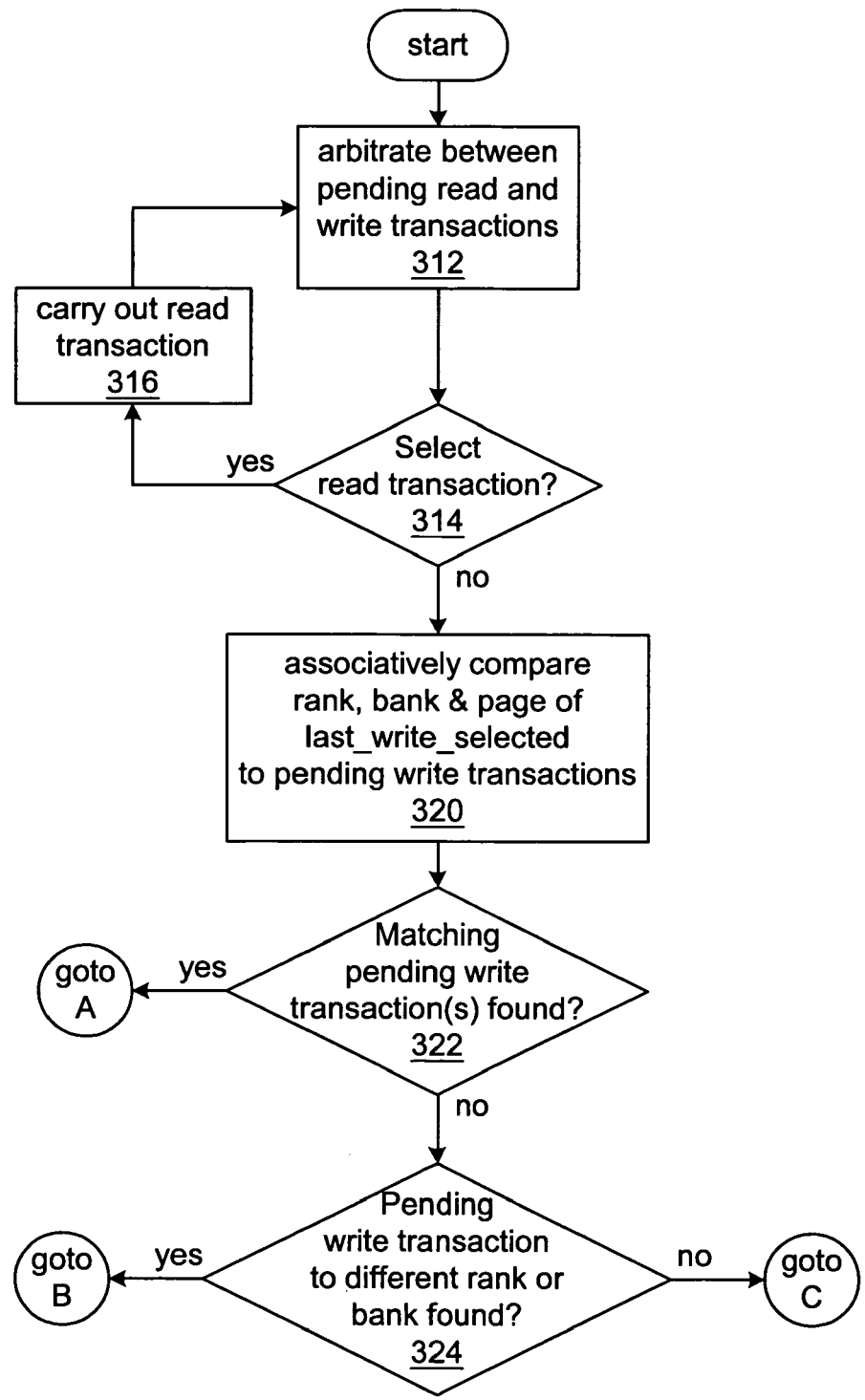
FIGS. 3a, 3b, 3c and 3d, together, are a flow chart of an embodiment.
Figure 3B:
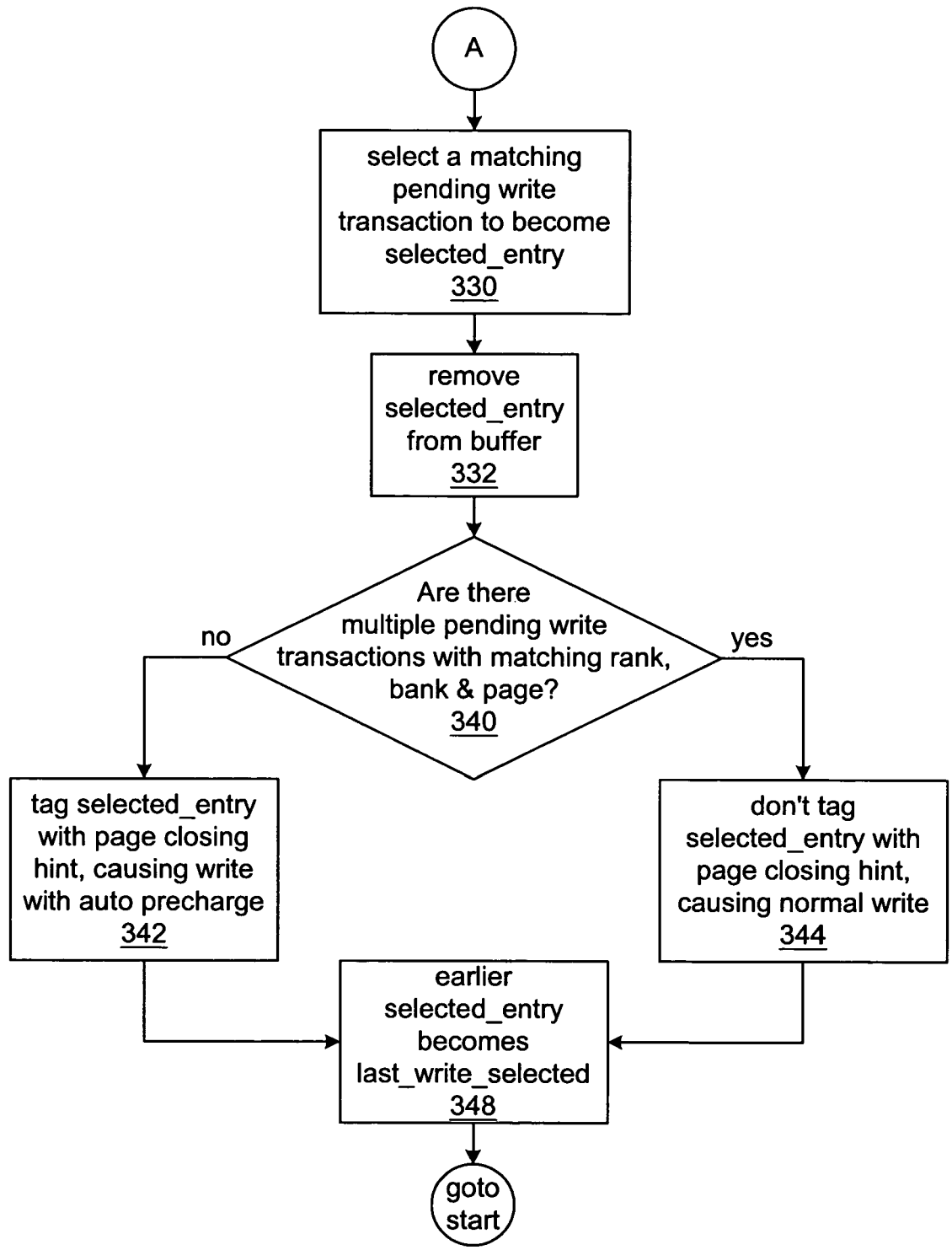
Figure 3C:
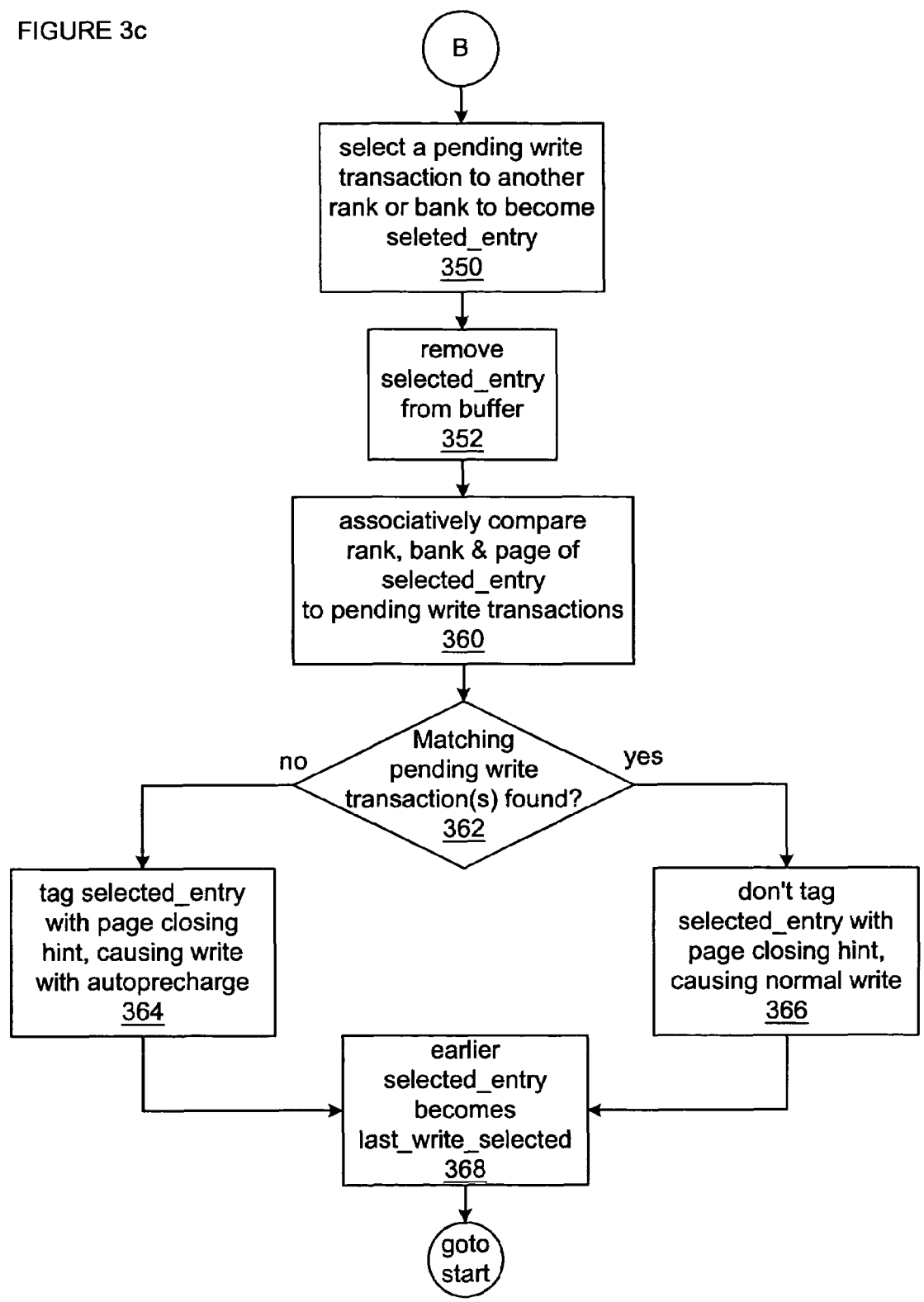
Figure 3D:
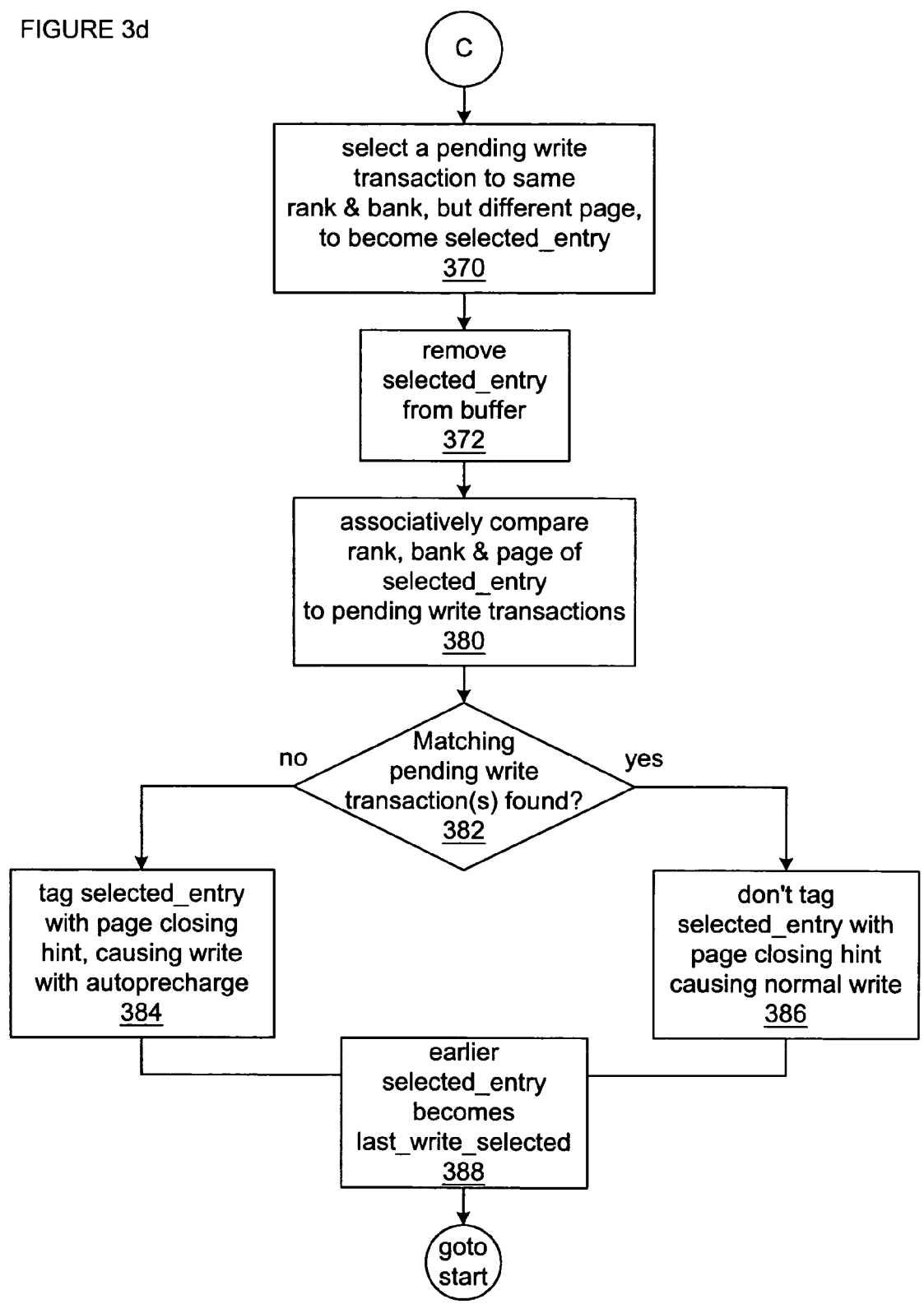

FIG. 2 is a simplified block diagram of an embodiment employing memory control circuitry. Memory control circuitry 200 is made up, at least in part, of read transaction buffer 272, write transaction CAM (content-addressable memory) 273, transaction arbiter 274, selected_entry latch 275, last_write_selected latch 276, multiplexer 277, write transaction control logic 278 and transaction scheduler 279. Memory control circuitry 200 may be a portion of a memory controller that controls the functions carried out by a memory device (not shown) as part of providing access to that memory device to other external devices (also not shown) coupled to the memory controller. In other words, an external device coupled to a memory controller of which memory control circuitry 200 may be a part, issues commands to the memory controller to store data within a memory device, and to retrieve stored data from a memory device and such a memory controller receives and relays these commands to the memory device in a format having timing and protocols compatible with that memory device.

Requests for read and write transactions are received from outside memory control circuitry 200 (whether from a device external to a memory controller of which memory control circuitry 200 is a part, or from other forms of circuitry), with requests for read transactions being stored as pending read transactions within read transaction buffer 272, and requests for write transactions being stored as pending write transactions within write transaction entries 273*a* of write transaction CAM 273. Transaction arbiter 274 determines whether a pending read transaction within read transaction buffer 272 or a pending write transaction within write transaction entries 273*a* of write transaction CAM 273 should be the next transaction to be carried out. While transaction arbiter 274 may employ any of a number of algorithms to make this determination, in some embodiments, transaction arbiter 274 simply gives any read transaction priority over any write transaction. If transaction arbiter 274 determines that a write transaction should be carried out, the actual selection of which write transaction is to be carried out may be made using a multiple part algorithm.

The address to which a pending write transaction is directed is copied to selected_entry latch 275 when that pending write transaction is selected, thereby becoming the selected_entry write transaction that is removed from write transaction entries 273a and sent to transaction scheduler 279 to be carried out. This same address is later copied to last_write_selected latch 276 to preserve that address before the next select_entry write transaction is selected and the address to which the next select_entry write transaction is directed is then copied into selected_entry latch 275. Multiplexer 277 is employed to select between the address stored within selected_entry latch 275 and the address stored within last_write_selected latch 276 to be latched and employed by comparand input 273b in one or more associative comparisons performed by associative comparator 273c between comparand input 273b and the addresses of pending write transactions stored within write transaction entries 273a, as will shortly be described in more detail. A bit vector indicating which of write transaction entries 273a, if any, are storing a pending write transaction that are a match to the comparand is generated by associative comparator 273c and transferred to write transaction control logic 278. Write transaction control logic 278, as a result of some of the associative comparisons that are carried out, may transmit a page closing hint signal to transaction scheduler 279 indicating that the page corresponding to the address to which a given selected_entry write transaction is directed should be closed immediately after the selected_entry write transaction is carried out. In some embodiments, this may entail transaction scheduler 279 either transmitting or causing to be transmitted a write command to a memory device to carry out the selected_entry write transaction with an auto precharge command embedded within that write command.

Describing the operation of memory control circuitry 200 more specifically, the address of the selected_entry write transaction (i.e., the address to which the currently selected write transaction is directed) is copied from selected_entry latch 275 to last_write_selected latch 276 to become the address to which the previously selected write transaction was directed, thereby preserving the address of what was the selected_entry write transaction. Transaction arbiter 274 makes its determination as to whether or not the next transaction is to be a read transaction or a write transaction, employing whatever algorithm. When transaction arbiter 274 does make the determination that a write transaction will be selected, a first associative comparison is made by associative comparator 273c between the rank, bank and page of the address of the last_write_selected write transaction copied into last_write_selected latch 276 and the rank, bank and page of all of the addresses of the pending write transactions stored in write transaction entries 273a. A first comparison result vector indicating the results of this first associative comparison is provided by associative comparator 273c to write transaction control logic 278, although in various alternative embodiments, the results may be signaled in other ways than by such a bit vector.

If the first comparison result vector indicates that there is a pending write transactions in write transaction entries 273a that has a rank, bank and page matching the rank, bank and page of the last_write_selected write transaction, then in response to the possibility that the page to which the last_write_selected write transaction was directed may still open, this pending write transaction is selected to become the new selected_entry write transaction. Also, if the first comparison result vector indicates that this new selected_entry write transaction is the only pending write transaction found to be directed to the same rank, bank and page as the last_write_selected write transaction, then the new selected_entry write transaction is removed from write transaction entries 273a and is sent to transaction scheduler 279 with an accompanying page closing hint from write transaction control logic 278 signaling to transaction scheduler 279 that the page to which the selected_entry write transaction is directed should be closed immediately after the selected_entry write transaction is carried out. However, if the first comparison result vector indicates that the new selected_entry write transaction is one of multiple pending write transactions directed to the same rank, bank and page as the last_write_selected write transaction, then the new selected_entry write transaction is sent to transaction scheduler 279 without an accompanying page closing hint signal from write transaction control logic 278. Either way, as a the new selected_entry write transaction is sent to transaction scheduler 279, a copy of the address to which the new selected_entry write transaction is directed is latched within selected_entry latch 275 for future use.

If the first comparison result vector indicates that there are no pending write transactions that have a rank, bank and page matching the rank, bank and page of the last_write_selected write transaction, but that there is a pending write transaction to a different rank or bank, then in response to the opportunity to avoid incurring the lengthy delay of a page miss from writing to a different page in the same rank and bank to which the last_write_selected write transaction was directed, this pending write transaction is selected to become the new selected_entry write transaction. The new selected_entry write transaction is removed from write transaction entries 273a and is sent to transaction scheduler 279 while a copy of the address to which the new selected entry is directed is latched within selected_entry latch 275. A second associative comparison is then made by associative comparator 273c, but this time, between the rank, bank and page of the address of the selected_entry write transaction (using the address stored within selected_entry latch 275) and the rank, bank and page of all of the addresses of the pending write transactions stored in write transaction entries 273a. A second comparison result vector indicating the results of this second associative comparison is provided by associative comparator 273c to write transaction control logic 278, although again, in various alternative embodiments, the results may be signaled in other ways than by such a bit vector. If the second comparison result vector indicates that there are no pending write transactions still in write transaction entries 273a that have a rank, bank and page matching the rank, bank and page of the selected_entry write transaction, then a page closing hint is provided by page closing hint logic 278 to transaction scheduler 279 to accompany the selected_entry write transaction to signal transaction scheduler 279 that the page to which the selected_entry write transaction is directed should be closed immediately after the selected_entry write transaction is carried out. However, if the second comparison result vector indicates that there is another pending transaction still in write transaction entries 273a that is directed to the same rank, bank and page as the selected_entry write transaction, then no such page closing hint is sent to transaction scheduler 279.

If the first comparison result vector indicates that there are no pending write transactions that have a rank, bank and page matching the rank, bank and page of the last_write_selected write transaction; and there are no pending write transactions to a different rank or bank than the last_write_selected write transaction; but there is a pending write transaction to the same rank and bank as the last_write_ selected write transaction, though to a different page; then although this may mean incurring the lengthy delay of a page miss from writing to a different page in the same rank and bank to which the last_write_selected write transaction was directed, this pending write transaction is selected as a last resort to become the new selected_entry write transaction. The new selected_entry write transaction is removed from write transaction entries 273a and is sent to transaction scheduler 279 while a copy of the address to which the new selected entry is directed is latched within selected_entry latch 275. A second associative comparison is then made by associative comparator 273c between the rank, bank and page of the address of the selected_entry write transaction (using the address stored within selected_entry latch 275) and the rank, bank and page of all of the addresses of the pending write transactions stored in write transaction entries 273a. If the second comparison result vector indicates that there are no pending write transactions still in write transaction entries 273a that have a rank, bank and page matching the rank, bank and page of the selected_entry write transaction, then a page closing hint is provided by page closing hint logic 278 to transaction scheduler 279 to accompany the selected_entry write transaction and signal transaction scheduler 279 that the page to which the selected_entry write transaction is directed should be closed immediately after the selected_entry write transaction is carried out. However, if the second comparison result vector indicates that there is another pending transaction still in write transaction entries 273a that is directed to the same rank, bank and page as the selected_entry write transaction, then no such page closing hint is sent to transaction scheduler 279.

FIGS. 3a, 3b, 3c and 3d, together, make up a flow chart of embodiments. At 312, arbitration logic arbitrates between any pending read transactions stored in a read transaction buffer and any pending write transactions stored in the write transaction buffer to select the next transaction. In some embodiments, such arbitration logic follows an algorithm of prioritizing a pending read transaction over a pending write transaction, and so at 314, if there is a pending read transaction is to be selected (perhaps over a pending write transaction), then that pending read transaction is carried out at 316, followed by further arbitration at 312. However, in other embodiments, other algorithms may be employed for selecting between pending read and write transactions. If there are no pending read transactions at 314, then at 320, an associative comparison is made between the rank, bank and page of the address to which the last_write_selected write transaction was directed and addresses to which all of the pending write transactions stored in the write transaction buffer are directed.

At 322, if there are any pending write transactions in the write transaction buffer having a rank, bank and page that match the rank, bank and page of the last_write_selected write transaction, then it is possible that the page to which the last_write_selected write transaction was directed is still open, thereby providing an opportunity for another write transaction to be directed to the same page with minimal delay, unless the last_write_selected write transaction was followed by a different transaction (such as a read, refresh, etc.) which caused that page to be closed. At 330, one of those pending write transactions with matching rank, bank and page (if there is more than one from which to select) is selected to become the new selected_entry write transaction using any of a number of possible algorithms to make that selection, as those skilled in the art will recognize. At 332, this new selected_entry write transaction is removed from the write transaction buffer to be sent onward to other logic to be carried out, while the address of the selected_entry write transaction is latched for future use. At 340, if the selected_entry write transaction was the only pending write transaction to the same rank, bank and page from which to select the new last_write_selected write transaction, then it is known that there are currently no other pending write transactions in the write transaction buffer to the same rank, bank and page as the selected_entry write transaction, and so at 342, the selected_entry write transaction is sent onward to other logic to be carried out with a page closing hint signaling to the other logic that the page to which the selected_entry write transaction is directed should be closed immediately after the selected_entry write transaction is carried out to avoid a subsequent write transaction that might be to the same bank (but presumably, not the same page) having to incur the lengthy delay resulting from a page miss. In some embodiments, this page closing hint would result in the other logic transmitting a write command with auto precharge for the selected_entry write transaction. However, at 340, if the selected_entry was one of multiple matches from which a selection was made, then it is known that there are still other pending write transactions in the write transaction buffer to the same rank, bank and page as the selected_entry, and so at 344, the selected_entry write transaction is sent onward to other logic to be carried out without a page closing hint so that the page to which the selected_entry is directed may remain open for what is presumed will be a subsequent write transaction to the same rank, bank and page selected from among the pending write transactions stored in the write transaction buffer. Regardless of whether a page closing hint accompanies the selected_entry, at 348, the address of the selected_entry write transaction is copied to a latch for storing the address of the last_write_selected write transaction, thereby preserving the address of what was the selected_entry write transaction in preparation for the selection of another pending write transaction from those stored in a write transaction buffer to become the new selected_entry write transaction, before proceeding back to 312.

However, at 322, if there are no pending write transactions in the write transaction buffer having a rank, bank and page that match the rank, bank and page of the last_write_selected write transaction, then it is known that whatever pending write transaction is about to be selected as the selected_entry write transaction will not be to the same rank, bank and page as the last_write_selected write transaction. The results of the associative comparison made at 320 are further examined at 324 to determine if there is a pending write transaction to a different rank or bank within the write transaction buffer. It should be noted that the associative comparison at 320 may, in some embodiments, be a parallel pair of associative comparisons in which rank, bank and page are compared in one of the parallel associative comparisons, while only rank and bank are compared in the other associative comparison. In such embodiments, the results from the parallel associative comparison that included comparing pages is used at 322, while the results from the parallel associative comparison not including the comparison of pages is used at 324, if needed (since depending on what occurs at 322, 324 may be skipped). Alternatively, in other embodiments, the associative comparison at 320 may be made up of a primary associative comparison of rank, bank and page in preparation for 322, immediately followed by a secondary associative comparison of only rank and bank in preparation for 324, if needed. As those skilled in the art will appreciate, still other variations of this form of dual associative comparison or single comparison employing an algorithm that provides dual results are possible without departing from the spirit and scope of the claimed invention.

At 324, if there are any pending write transactions in the write transaction buffer directed to a different rank and/or bank than the rank and bank of the last_write_selected write transaction, then it is possible to avoid incurring the delay that may be incurred from waiting for the completion of the closing of the page to which the last_write_selected write transaction was directed by selecting a pending write transaction from the write transaction buffer that is directed to a different rank and/or bank. At 350, one of those pending write transactions to a different rank and/or bank (if there is more than one from which to select) is selected to become the new selected_entry write transaction using any of a number of possible algorithms to make that selection, as those skilled in the art will recognize. At 352, this new selected_entry write transaction is removed from the write transaction buffer to be sent onward to other logic to be carried out, while the address of the selected_entry write transaction is latched for future use. At 360, an associative comparison is made between the rank, bank and page of the selected_entry address just latched and all of the pending write transactions stored in the write transaction buffer. At 362, if no pending write transactions are found having a matching rank, bank and page, then it is deemed unlikely that there will be a subsequent write transaction directed to the same rank and bank that will also be directed to the same page as the selected_entry write transaction, and so at 364, the selected_entry write transaction is sent onward to the other logic accompanied by a page closing hint signaling to the other logic that the page to which the selected_entry write transaction is directed should be closed immediately after the selected_entry write transaction is carried out to avoid incurring the lengthy delay of a page miss when a subsequent write transaction to the same rank and bank (but presumably, not the same page) is executed. However, at 362, if any pending write transactions are found having a matching rank, bank and page, then it is possible that after the selected_entry write transaction is carried out, the page to which the selected_entry write transaction is directed may remain open such that another write transaction directed to the same page may be selected from the pending write transactions stored in the write transaction buffer and directed to the same page with minimal delay, unless the selected_entry write transaction is followed by a different intervening transaction (such as a read, refresh, etc.) which causes that page to be closed. If any such pending write transaction with matching rank, bank and page is found, then at 366, no page closing hint accompanies the selected_entry transaction to the other logic. Regardless of whether a page closing hint accompanies the selected_entry, at 368, the address of the selected_entry write transaction is copied to a latch for storing the address of the last_write_selected write transaction, thereby preserving the address of what was the selected_entry write transaction in preparation for the selection of another pending write transaction from those stored in a write transaction buffer to become the new selected_entry write transaction, before proceeding back to 312.

At 324, if there are no pending write transactions in the write transaction buffer directed to a different rank and/or bank than the rank and bank of the last_write_selected write transaction, then it may not be possible to avoid incurring the delay that may be incurred from waiting for the completion of the closing of the page to which the last_write_selected write transaction was directed as a result of having to select a pending write transaction from the write transaction buffer that is directed to the same rank and bank, but to a different page. At 370, one of those pending write transactions to the same rank and bank, but a different page (if there is more than one from which to select), is selected to become the new selected_entry write transaction using any of a number of possible algorithms to make that selection, as those skilled in the art will recognize. At 372, this new selected_entry write transaction is removed from the write transaction buffer to be sent onward to other logic to be carried out, while the address of the selected_entry write transaction is latched for future use. At 380, an associative comparison is made between the rank, bank and page of the selected_entry address just latched and all of the pending write transactions stored in the write transaction buffer. At 382, if no pending write transactions are found having a matching rank, bank and page, then it is deemed unlikely that there will be a subsequent write transaction directed to the same rank and bank that will also be directed to the same page as the selected_entry write transaction, and so at 384, the selected_entry write transaction is sent onward to the other logic accompanied by a page closing hint signaling to the other logic that the page to which the selected_entry write transaction is directed should be closed immediately after the selected_entry write transaction is carried out to avoid incurring the lengthy delay of a page miss when a subsequent write transaction to the same rank and bank (but presumably, not the same page) is executed. However, at 382, if any pending write transactions are found having a matching rank, bank and page, then it is possible that after the selected_entry write transaction is carried out, the page to which the selected_entry write transaction is directed may remain open such that another write transaction directed to the same page may be selected from the pending write transactions stored in the write transaction buffer and directed to the same page with minimal delay, unless the selected_entry write transaction is followed by a different intervening transaction (such as a read, refresh, etc.) which causes that page to be closed. If any such pending write transaction with matching rank, bank and page is found, then at 386, no page closing hint accompanies the selected_entry transaction to the other logic. Regardless of whether a page closing hint accompanies the selected_entry, at 388, the address of the selected_entry write transaction is copied to a latch for storing the address of the last_write_selected write transaction, thereby preserving the address of what was the selected_entry write transaction in preparation for the selection of another pending write transaction from those stored in a write transaction buffer to become the new selected_entry write transaction, before proceeding back to 312.

Figure 4A:
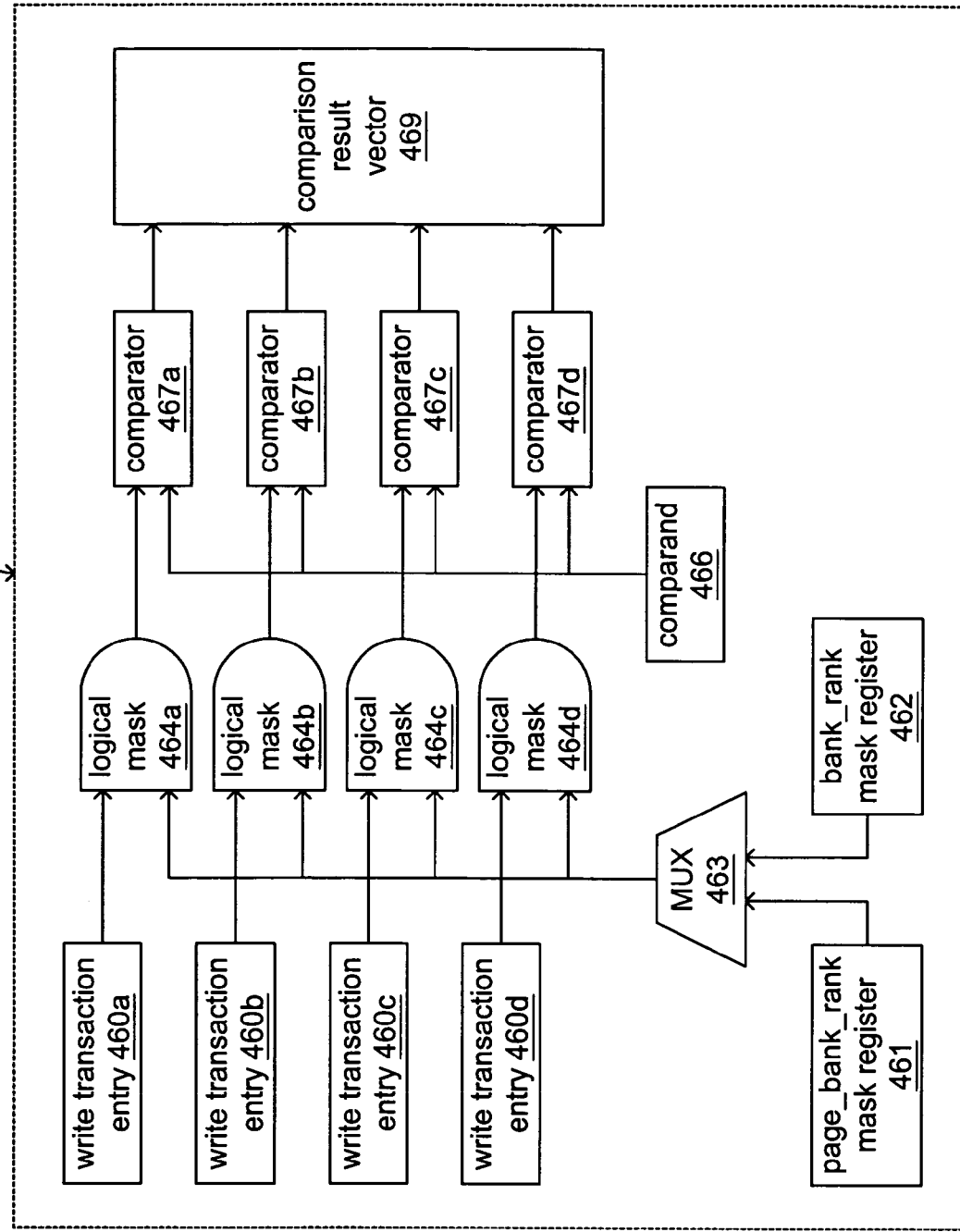
FIGS. 4a and 4b are block diagrams of other embodiments employing a portion of memory control circuitry.
Figure 4B:
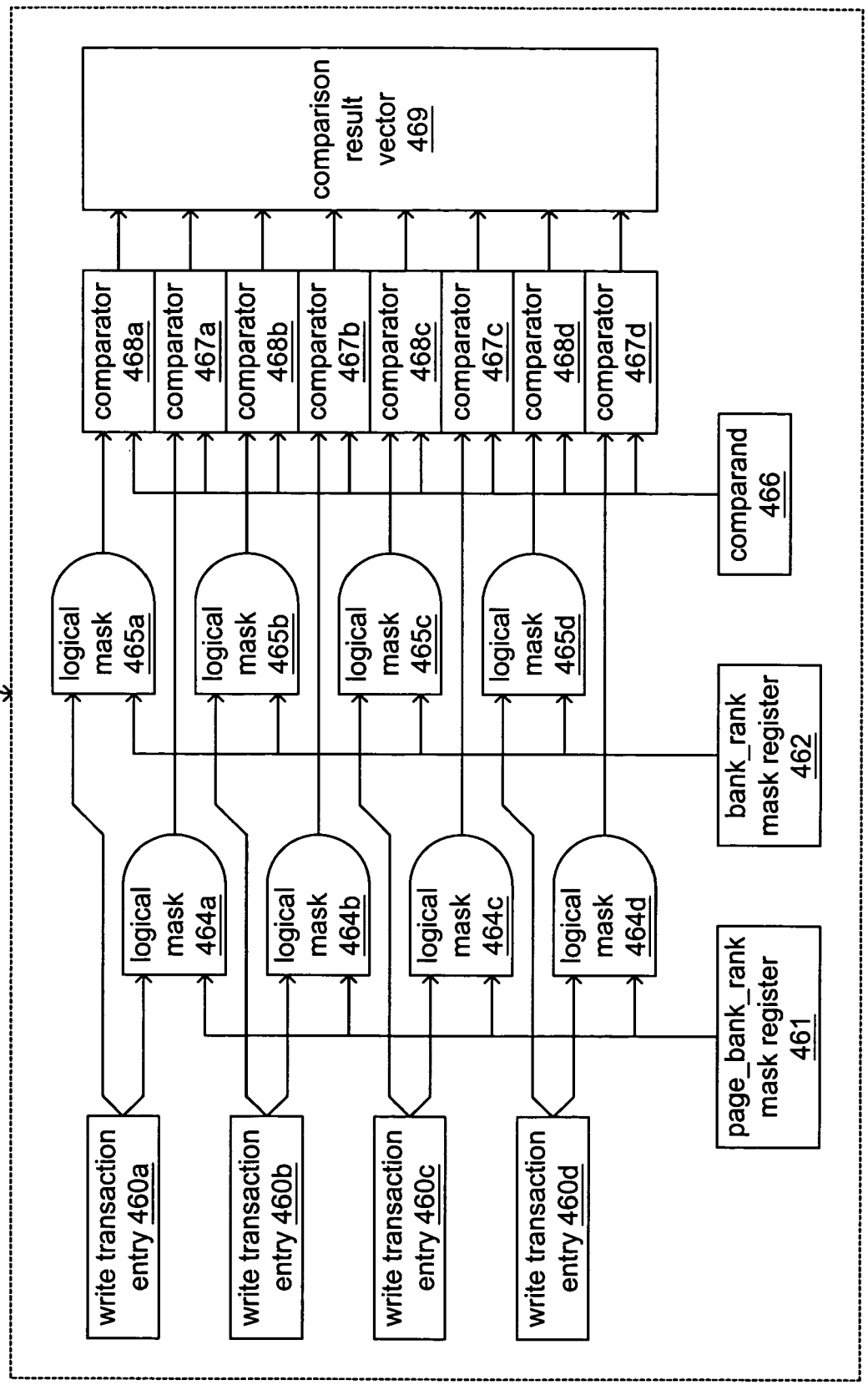

FIGS. 4a and 4b are block diagrams of other embodiments employing memory control circuitry. In various possible embodiments, memory control circuitry 400 of the form depicted in either FIG. 4a or 4b may make up a portion of memory controller 170 of FIG. 1 and/or may make up a subset of memory control circuitry 200 of FIG. 2. Memory control circuitry 400 in both FIGS. 4a and 4b is made up of write transaction entries 460a-d, page_bank_rank mask register 461, and bank_rank mask register 462. In various possible embodiments, memory control circuitry 400 may be deemed to be a portion of a content-addressable memory device.

Both forms of memory control circuitry 400 receive comparand 466, which may be either the address to which a previous write transaction (such as last_write_selected) was directed or the address to which a currently selected write transaction (such as selected_entry) is directed. The exact form of comparand 466 may either be a binary value identifying the starting address of a portion of memory to which a write transaction was/is directed, or may be a concatenation of values that separately specify the memory bus (i.e., channel), rank, bank, row (i.e., page) and/or column of a portion of a memory device to which a write transaction was/is directed. If comparand 466 is in the form of a binary starting address, then in some embodiments, further logic (not shown) may be employed to convert comparand 466 into equivalent values specifying channel, rank, bank, page and/or column for use in carrying out associative comparisons. Alternatively, such associative comparisons may be carried out on bits of a binary starting address form of comparand 466, directly, without such a conversion.

Both forms of memory control circuitry 400 also receive and store at least the addresses to which write transactions were/are directed in write transaction entries 460a-d. As those skilled in the art will readily recognize, the exact quantity of write transaction entries may be changed without departing from the spirit and scope of the claimed invention.

Both forms of memory control circuitry 400 are programmed with masking values in both page_bank_rank mask register 461 and bank_rank mask register 462, and both masking values are determined, at least in part, by the configuration of the memory device(s) with which memory control circuitry 400 is used. The masking value in page_bank_rank mask register 461 is chosen to screen out bits specifying (or at least correlating with) one or more columns of memory cells within a memory device that make up a page. In other words, the masking value in page_bank_rank mask register 461 is chosen to allow only bits specifying (or at least correlating with) the rank, bank and page (perhaps, also the channel) portions of an address to which a write transaction was/is directed. The masking value in bank_rank mask register 462 is chosen to additionally screen out bits specifying (or at least correlating with) one or more columns, such that only bits specifying (or at least correlating with) the rank and bank (perhaps, also the channel) portions of an address to which a write transaction was/is directed. Having both page_bank_rank mask register 461 and bank_rank mask register 462 in both forms of memory control circuitry 400 allows both forms of memory control circuitry 400 to make an associative comparison of rank, bank and page (perhaps also channel), and an associative comparison limited to rank and bank (perhaps also channel).

Where the two forms of memory control circuitry 400 depicted in FIGS. 4a and 4b differ is in whether these two associative comparisons are carried out serially (FIG. 4a) or in parallel (FIG. 4b). In FIG. 4a, the two associative comparisons are carried out serially, with multiplexer 463 selecting the mask value from either page_bank_rank mask register 461 or bank_rank mask register 462, depending on which associative comparison is being made. The chosen mask value becomes one of the two inputs, along with addresses from corresponding ones of write transaction entries 460a-d, to logical masks 464a to carry out the masking of bits that are not desired to become part of the associative comparison. The outputs of logical masks 464a-d, in turn, become inputs to corresponding ones of comparators 467a-d, along with comparand 466, and the outputs of comparators 467a-d form comparison result vector 469. In FIG. 4b, the two associative comparisons are carried out in parallel, with the mask values of page_bank_rank mask register 461 and bank_rank mask register 462 becoming inputs to logical masks 464a-d and 465a-d, respectively, along with addresses from corresponding ones of write transaction entries 460a-d (460a input to both 464a and 465a, and so on). Logical masks 464a-d and 465a-d carry out the masking of bits that are not desired to become part of their respective associative comparisons. Logical masks 464a-d supply their outputs to corresponding ones of comparators 467a-d, along with comparand 466, and similarly, logical masks 465a-d supply their outputs to corresponding ones of comparators 468a-d, also along with comparand 466. In some embodiments, the outputs of comparators 467a-d and 468a-d form the single comparison result vector 469, though a pair of comparison result vectors might be formed in alternate embodiments. In still other embodiments, logic between comparators 467a-d and comparators 468a-d of may be shared to avoid duplication of logic in comparing rank and bank values.

Figure 5:
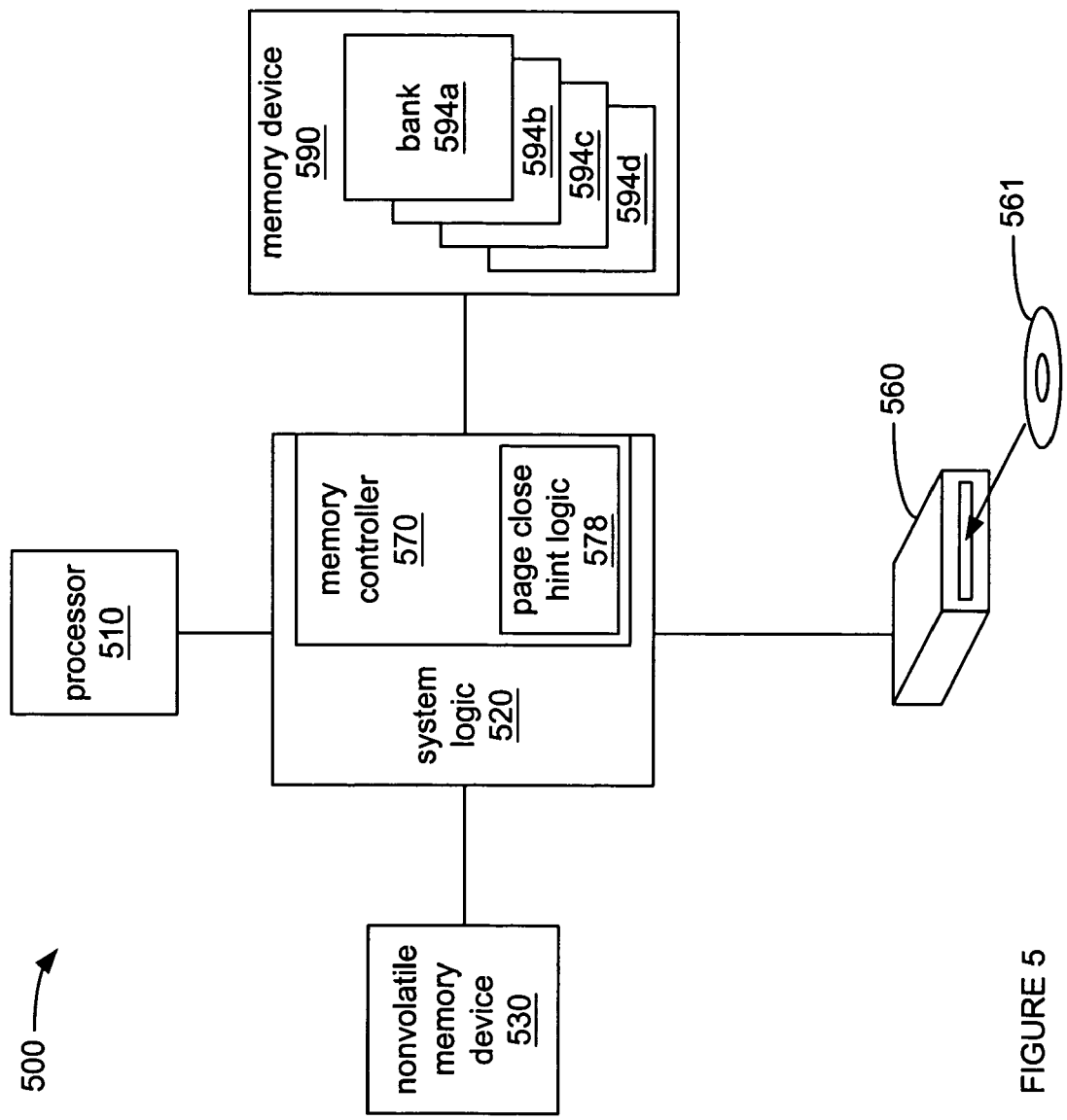
FIG. 5 is a block diagram of an embodiment employing a computer system.

FIG. 5 is a simplified block diagram of an embodiment employing a computer system. Computer system 500 is, at least in part, made up of processor 510, system logic 520, and memory device 590. System logic 520 is coupled to processor 510 and performs various functions in support of processor 510 including providing processor 510 with access to memory device 590 to which system logic 520 is also coupled, using memory controller 570 within system logic 520. Processor 510, system logic 520 and memory device 590 make up a form of core for computer system 500 that is capable of supporting the execution of machine readable instructions by processor 510 and the storage of data and instructions within memory device 590.

In various embodiments, processor 510 could be any of a variety of types of processor including a processor capable of executing at least a portion of the widely known and used "x86" instruction set, and in other various embodiments, there could be more than one processor. In various embodiments, memory device 590 could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 570 provides logic 520 with an appropriate interface for the type of memory. At least a portion of the memory cells of memory device 590 are divided into banks 594a-d, each of which are made up of memory cells organized into rows and columns in a two dimensional memory array. To access a portion of the memory cells within memory device 590, that portion must be addressed by memory controller 570 with a combination of bank, row and column addresses/selects, and where appropriate, with rank selected via chip select signals or other mechanism. As those skilled in the art will recognize, the depiction of a single memory device 590 with four banks of memory cells, namely banks 594a-d, is but an example of a memory system that could be a part of a computer system, and that a larger number of memory devices and/or a differing number of ranks and/or banks within memory devices could be used without departing from the spirit and scope of the present invention as hereinafter claimed.

In some embodiments, system logic 520 is coupled to and provides processor 510 with access to storage device 560 by which data and/or instructions carried by storage media 561 may be accessed. Storage media 561 may be of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 530 is coupled to system logic 520 (or other part of computer system 500) and provides storage for an initial series of instructions executed at a time when computer system 500 is either "reset" or initialized (for example, when computer system 500 is "turned on" or "powered up") to perform tasks needed to prepare computer system 500 for normal use. In some variations of such embodiments, upon initialization or resetting of computer system 500, processor 510 accesses nonvolatile memory device 530 to retrieve instructions to be executed to prepare memory controller 570 for normal use in providing access for processor 510 to memory device 590. It may be that these same retrieved instructions are executed to prepare system logic 520 for normal use in providing access to storage device 560 and whatever form of storage media 561 that may be used by storage device 560.

In some embodiments, storage media 561 carries machine-accessible instructions to be executed by processor 510 to cause processor 510 to carry out one or more tests of memory device 590 and/or to interrogate a portion of nonvolatile storage within memory device 590 to determine various characteristics of memory device 590 and/or to determine what functions memory device 590 may support. Once the configuration of ranks, banks, rows and columns of memory device 590 have been determined, then processor 510 may be caused to program or otherwise configure memory controller 570 to make use of the organization of ranks, banks, rows and columns within memory device 590 to select pending write transactions and/or to employ page closing hints, as earlier described, in an effort to reduce instances in which page misses and their associated lengthy delays are encountered in write transactions to memory device 590.

Figure 6:
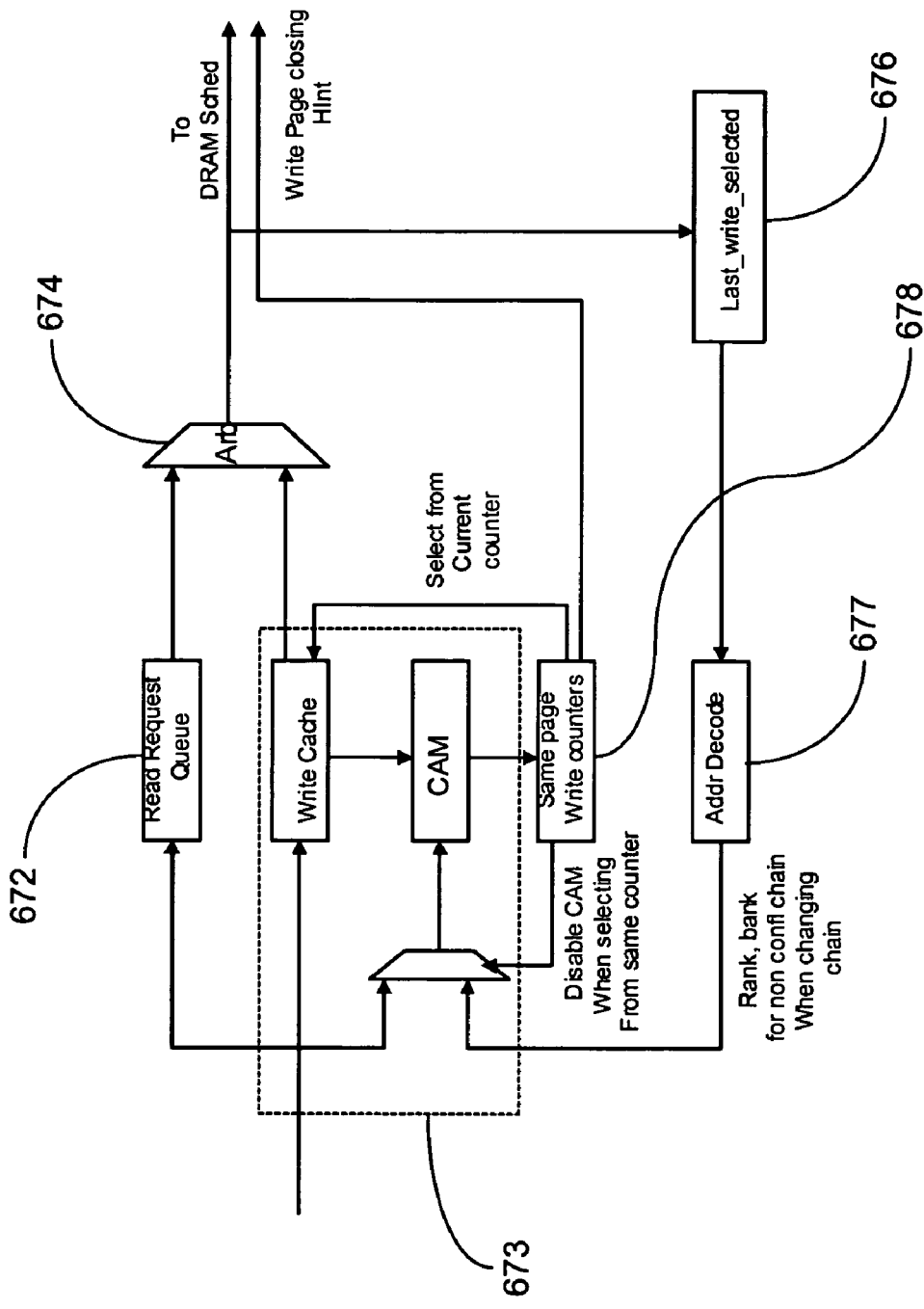
FIG. 6 is a block diagram of another embodiment employing memory control circuitry.

FIG. 6 is another embodiment employing memory control circuitry as an alternative to embodiments depicted in FIGS. 2 and 3a-d. In a manner not unlike the memory control circuitry of FIG. 2, requested read transactions are posted in read request queue 672, requested write transactions are posted in a write cache within CAM logic 673, and posted read and posted write transactions are selected through arbiter 674 in accordance with any of a number of possible algorithms for being sent to a transaction scheduler (not shown) for execution, while addresses for the last write transaction that was selected are stored within last_write_selected latch 676 (with those addresses being decoded into rank, bank, etc., as needed, depending on a given variation of an embodiment). As depicted in FIG. 6 and detailed in the following insert, each new request for a write transaction is associatively compared, using CAM logic 673, with the rank, bank and page of pending write transactions already stored in the write cache of CAM logic 673 as each such new request is received:

```
At the time of reception of a Write
    CAM new write with writes in the cache;
    If (matches rank, bank, page of existing writes) {
        Increment count for that page;
        Add a index to the write to the counter structure;
    }
    else {
        enter a new count entry in the vector;
        Add a index to the write to the counter structure;
        set count = 1;
    }
```

If the associative comparison reveals a match to a pending write transaction, then a counter within write counters 678 corresponding to all pending write transactions to that same rank, bank and page is incremented, and an index to this new pending write transaction now stored within the write cache of CAM logic 673 is added to the corresponding counter structure that points to all pending write transactions to that rank, bank and page. However, if the associative comparison reveals no match to any pending write transaction, then a new vector entry is made corresponding to a new counter being allocated and set to 1 to reflect the presence of this one new pending write transaction to a rank, bank and page for which a counter within write counters 678 and counter structure have not already been allocated, and an index to this new pending write transaction now stored within the write cache of CAM logic 673 is placed into a corresponding counter structure.

As also depicted in FIG. 6 and detailed in the following insert, employing CAM logic 673 to effectively organize new requests for write transactions as they are received, makes it possible, under some circumstances, to avoid having to make further use of CAM logic 673 as pending write transactions are selected to be executed by checking the count for how many write transactions to the same rank, bank and page as the last write transaction selected, the address of which is stored in last_write_selected latch 676:

At the time of selection of write

```
At the time of selection of write
//Write selection and page closing algorithm:
//last_write_selected: write selected in a previous arbitration cycle
do on each arbitration cycle {
    if (Counter for the same page as last_write_selected exists) {
        disable CAM; //save some power
        if (count > 1) {
            selected_entry=select next write index;
                    //could select any other write index for that counter
            write_page_close_hint = 0;
            Remove selected_entry from write cache;
            dispatch selected_entry;
            last_write_selected = selected_entry;
            selected counter--;
        }
        else {
            selected_entry=select next write index;
            write_page_close_hint = 1;
            Remove selected_entry from write cache;
            dispatch selected_entry;
            last_write_selected = selected_entry;
            selected counter--;
        }
    }
    Else if (Counter exists that is non-conflicting with last_write_selected) {
        if (count > 1) {
            selected_entry=select next write index;
            write_page_close_hint = 0;
            Remove selected_entry from write cache;
            dispatch selected_entry;
            last_write_selected = selected_entry;
            selected counter--;
        }
        else {
            selected_entry=select next write index;
            write_page_close_hint = 1;
            Remove selected_entry from write cache;
            dispatch selected_entry;
            last_write_selected = selected_entry;
            Selected counter--;
        }
    }
    Else { //we have to select a counter that has writes conflicting with the last_write_selected
        if (count > 1) {
            selected_entry=select next write index;
            write_page_close_hint = 0;
            Remove selected_entry from write cache;
            dispatch selected_entry;
            last_write_selected = selected_entry;
```

```
        Selected counter--;
    }
    else {
        selected_entry=select next write index;
        write_page_close_hint = 1;
        Remove selected_entry from write cache;
        dispatch selected_entry;
        last_write_selected = selected_entry;
        Selected counter--;
    }
}
```

On each occasion that arbiter 674 selects a pending write transaction to be executed, a check is made for a counter within write counters 678 that is associated with the rank, bank and page of the last pending write transaction that was selected to be executed (the address of which is stored in last_write_selected latch 676) that has a non-zero count value indicating that there is at least one more pending write transaction to that same rank, bank and page. If a counter is found and has a nonzero value greater than 1, thereby indicating that more than one such pending write transaction is available, then one of those pending write transactions is selected, a write page closing hint is provided by writer counters 678 that indicates not to close the page, the pending write transaction is removed from the write cache to be executed while its address is copied into last_write_selected latch 676, and the counter is decremented; while if a counter is found and has a nonzero value equal to 1, thereby indicating that only one such pending write transaction is available, then much the same thing happens with the exception that a write page closing hint is provided by write counters 678 that indicates that the page should be closed immediately after the one pending write transaction is executed. However, if no counter is found that is associated with the rank, bank and page of the last write transaction that was selected for execution, then an associative comparison is made employing CAM logic 673 to locate a pending write transaction that is directed to a different rank or bank than that of the last write transaction selected for execution (i.e., a "non-conflicting" write transaction), and if such a non-conflicting pending write transaction is found, then a check is made of the counter within write counters 678 that is associated with that pending write transaction to determine if the counter value is greater than 1 or equal to 1. If such a non-conflicting pending write transaction is found and the associated counter value is greater than 1, then the pending write transaction is removed from the write cache to be executed, no write page closing hint is sent by write counters 678, and the associated counter is decremented; while if the associated counter value is equal to 1 (indicating that there is only this one pending write transaction to this one set of non-conflicting rank, bank and page), much the same thing happens with the exception that a write page closing hint is provided by write counter 678. Alternatively, if there is no such non-conflicting pending write transaction, then as a last resort, a pending write transaction to the same rank and bank as the last write transaction that was selected and executed, but to a different page (i.e., a "conflicting" pending write transaction), is selected to be executed, and the counter within write counters 678 associated with this conflicting pending write transaction is checked to determine if the counter value is greater than 1 or equal to 1. If such a conflicting pending write transaction is found and the associated counter value is greater than 1, then the pending write transaction is removed from the write cache to be executed, no write page closing hint is sent by write counters 678, and the associated counter is decremented; while if the associated counter value is equal to 1, much the same thing happens with the exception that a write page closing hint is provided by write counter 678.

As further depicted in FIG. 6 and detailed in the following insert, the transaction scheduler receiving selected read and write transactions through arbiter 674 and write page closing hints from write counters 678 may selectively act on write page closing hints:

```
//Algorithm for using write page closing hint in the DRAM command
scheduler
if (CAS scheduled for the write transaction scheduled) {
    if (write_page_close_hint) {
        auto-precharge the page for the write scheduled;
    }
}
```

Such a transaction scheduler may condition acting on a write page closing hint received from write counters 678 (perhaps by transmitting a write command with autoprecharge, instead of simply transmitting a write command) such that a write page closing hint will be acted upon only if the write transaction received through arbiter 674 with which the write page closing hint is associated would entail the transmission of a column address to execute (i.e., transmission of the write command entails also transmitting a column address).

Figure 7:
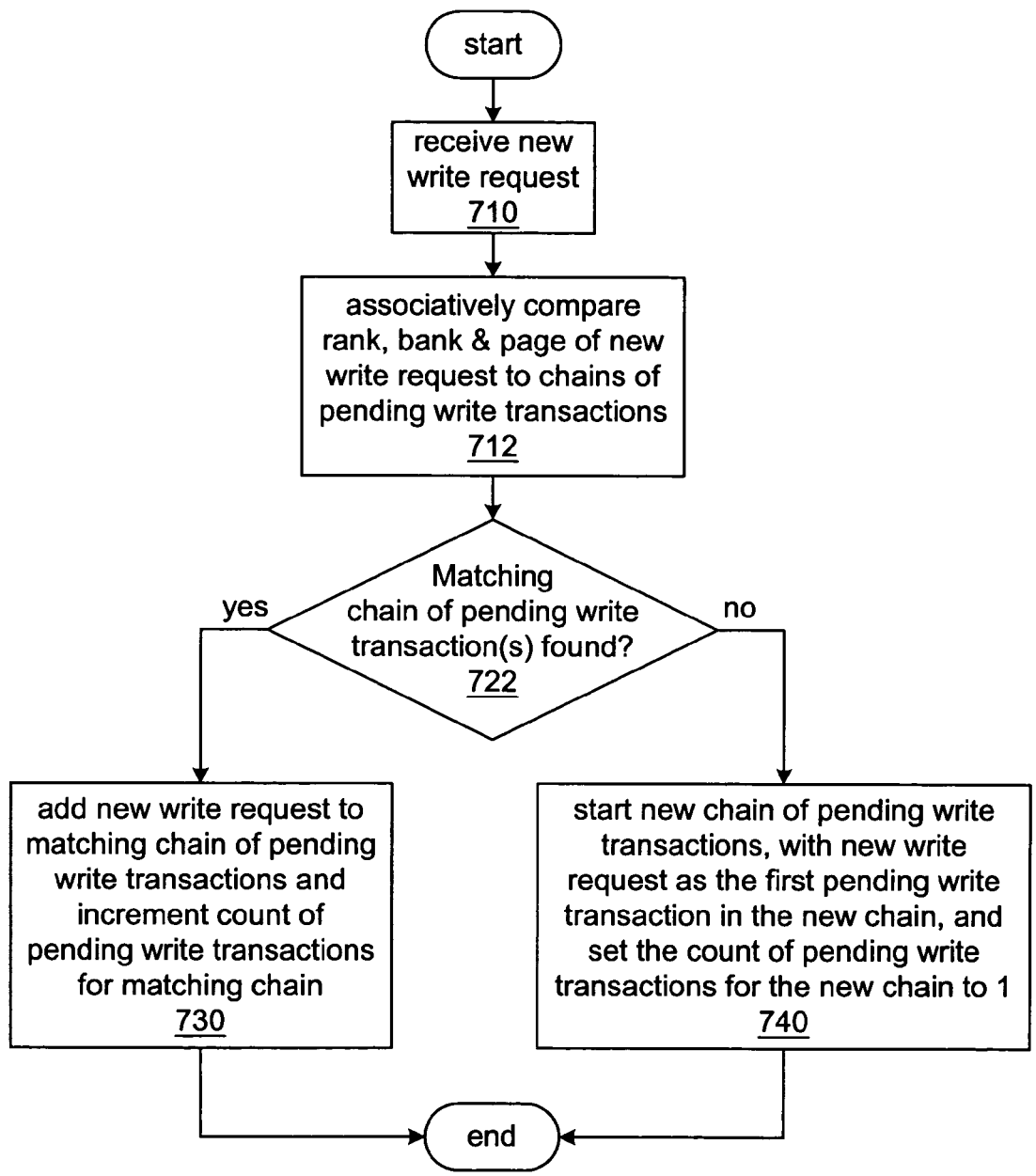
FIGS. 7, 8a-8d, together, are a flow chart of an embodiment.
Figure 8A:
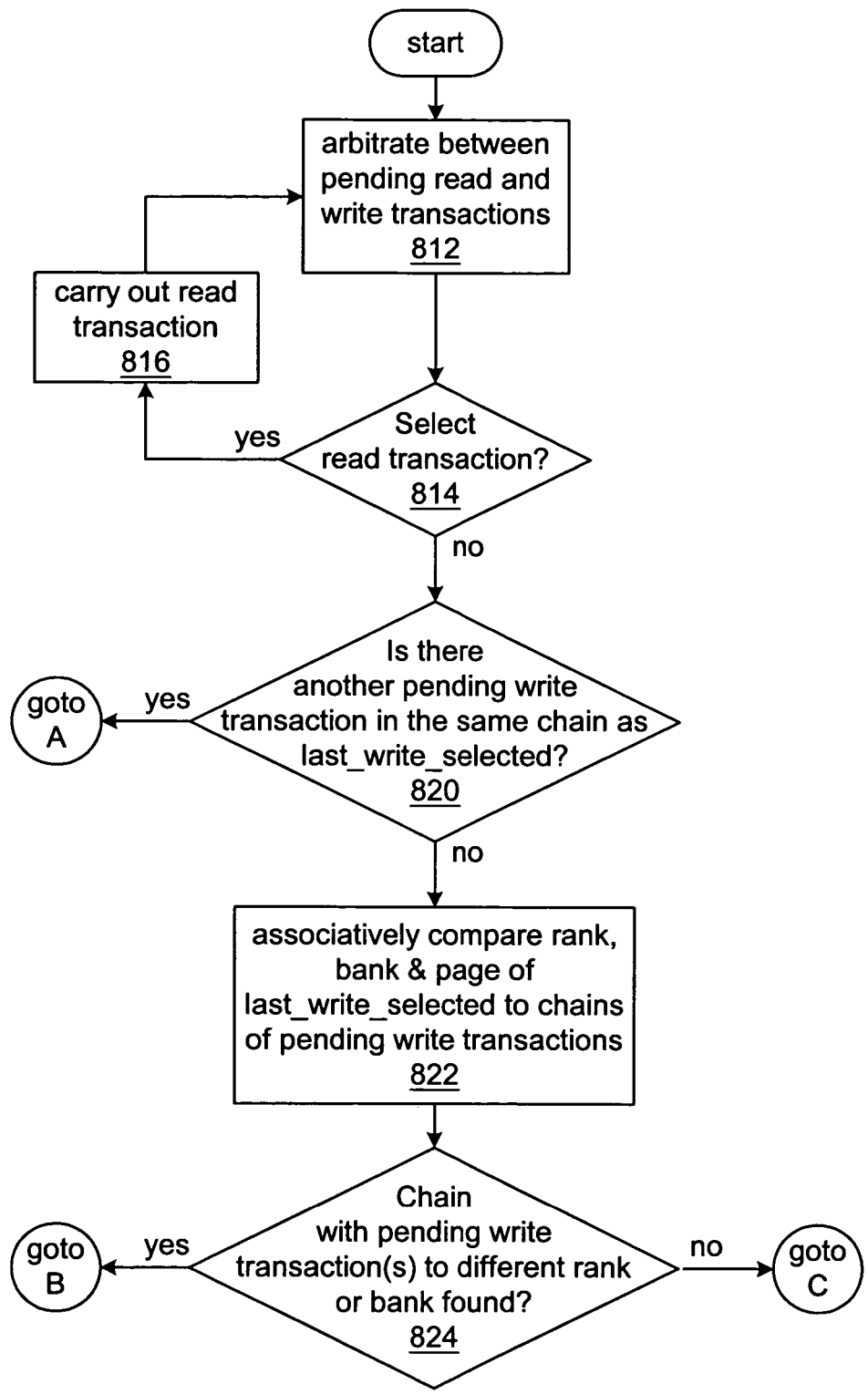
Figure 8B:
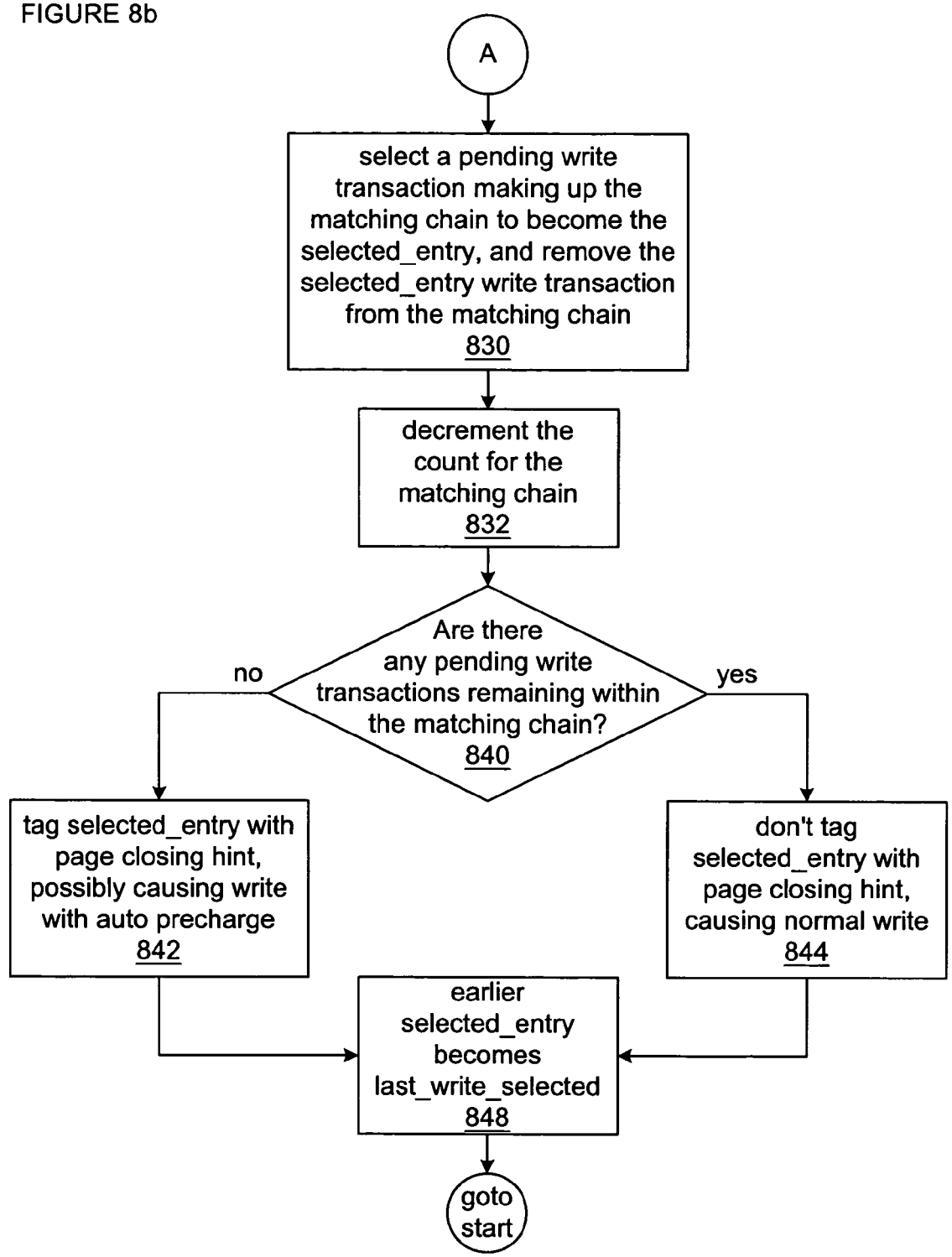
Figure 8C:
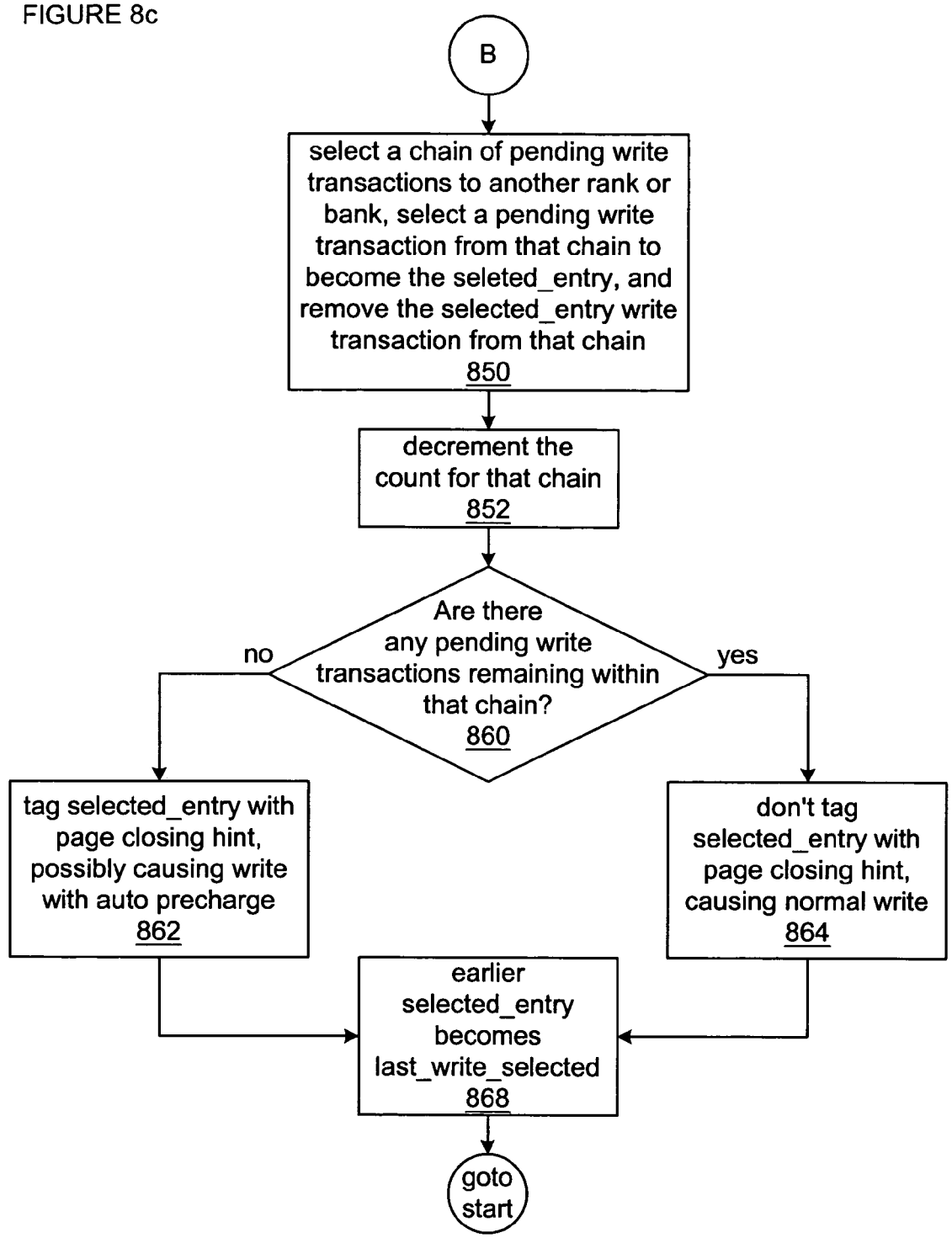
Figure 8D:
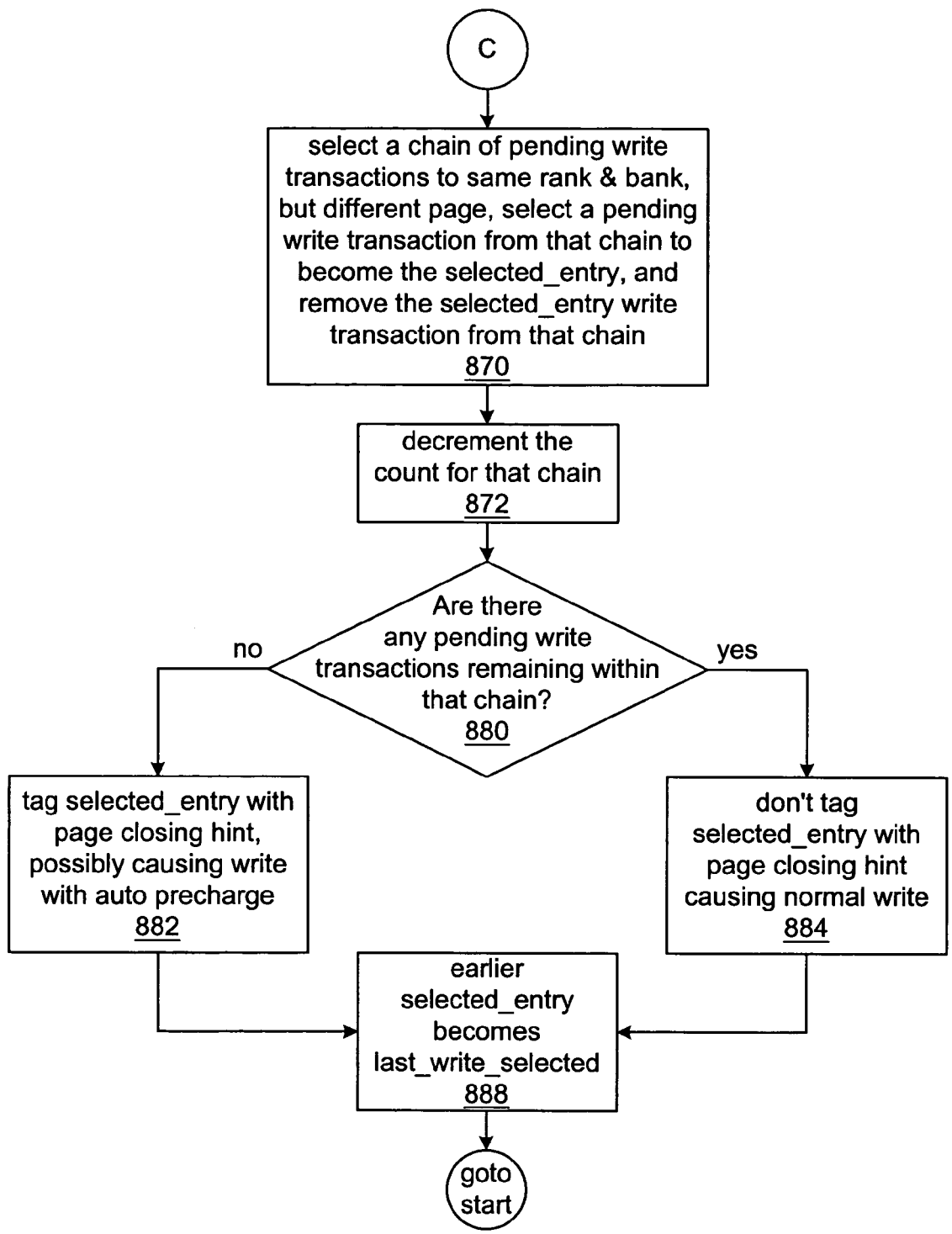

FIGS. 7, 8a, 8b, 8c and 8d, together, make up a flow chart of embodiments. Referring to FIG. 7, a new request for a write transaction is received at 710. At 712, the rank, bank and page of the new write request is associatively compared to the ranks, banks and pages of the existing chains (i.e., groups of pending write transactions that have identical ranks, banks and pages). If at 722, a chain is found that has a rank, bank and page that matches those of the new write request, then at 730, the write transaction requested in the new write request is added to that chain and the count of pending write transactions making up that chain is incremented. However, if at 722, no chain is found that has a rank, bank and page that match those of the new write request, then at 740, a new chain is started that is made up of the write transaction requested in the new write request, and the count of pending write transactions making up that chain is set to indicate that there is one pending write transaction making up that chain.

Referring to FIGS. 8a-d, at 812, arbitration logic arbitrates between any pending read transactions stored in a read transaction buffer and any pending write transactions stored in the write transaction buffer to select the next transaction. In some embodiments, such arbitration logic follows an algorithm of prioritizing a pending read transaction over a pending write transaction, and so at 814, if there is a pending read transaction, then that pending read transaction is selected over any pending write transaction, and is carried out at 816, followed by further arbitration at 812. However, in other embodiments, other algorithms may be employed for selecting between pending read and write transactions. However, if there are no pending read transactions at 814, then at 820, a check is made to determine if there are any more pending write transactions in the chain of pending write transactions of which the last_write_selected write transaction was a part. In some variations, this check is made by examining the count of pending write transactions making up that chain is checked to determine the quantity of pending write transactions remaining within that chain. In other variations, this check may include making a determination as to whether or not that chain continues to exist, with a determination that the chain no longer exists being interpreted to mean that there were no more pending write transactions within that chain, and this resulted in the chain being removed, deleted or otherwise nullified or disabled.

At 820, if there still is a pending write transaction within the chain of which the last_write_selected write transaction was a part, then a pending write transaction is selected to become the new selected_entry write transaction to be carried out and removed from that chain at 830, and the count of pending write transactions making up that chain is decremented at 832. A check is made at 840 to determine if there are still other pending write transactions within that chain (i.e., if the new selected_entry write transaction just removed from that chain at 830 was not the last one). If there are no more pending write transactions within that chain (and perhaps, that chain has now ceased to exist or has been otherwise cleared or nullified, as a result of there being no more such pending write transactions), then the selected_entry write transaction is tagged with a page closing hint at 842, possibly resulting in the write transaction being implemented as a write with auto precharge. However, if there are one or more pending write transactions within that chain, then the selected_entry write transaction is not tagged with a page closing hint, and is implemented as a normal write at 844. Regardless of whether a page closing hint accompanies the selected_entry, at 848, the address of the selected_entry write transaction is also copied to a latch for storing the address of the selected_entry write transaction as the last_write_selected write transaction for later in use in making associative comparisons, before proceeding back to 812.

However, at 820, if there are no more pending write transactions in the chain of which the last_write_selected write transaction was a part, then it is known that whatever chain of pending write transactions from which a pending write transaction is about to be selected as the selected_entry write transaction will not be to the same rank, bank and page as the last_write_selected write transaction. As a result, at 822, an associative comparison is made between the rank, bank and page of the address to which the last_write_selected write transaction was directed and the ranks, banks and pages to which all of the chains of pending write transactions are directed.

At 824, if the associative comparison at 822 located any chains of pending write transactions in the write transaction buffer directed to a different rank and/or bank than the rank and bank of the last_write_selected write transaction, then it is possible to avoid incurring the delay that may be incurred from waiting for the completion of the closing of the page to which the last_write_selected write transaction was directed by selecting a chain of pending write transactions that are directed to a different rank and/or bank. At 850, one of those chains of pending write transactions to a different rank and/or bank (if there is more than chain one from which to select) is selected, and a pending write transaction making up that chain (if there is more than one pending write transaction within that chain from which to selected) is selected to become the new selected_entry write transaction using any of a number of possible algorithms to make that selection, as those skilled in the art will recognize, and this selected_entry write transaction is removed from that chain. At 852, the count of pending write transactions making up that chain is decremented. A check is made at 860 to determine if there are still other pending write transactions within that chain. If there are no more pending write transactions within that chain (and perhaps, that chain has now ceased to exist or has been otherwise cleared or nullified, as a result of there being no more such pending write transactions), then the selected_entry write transaction is tagged with a page closing hint at 862, possibly resulting in the write transaction being implemented as a write with auto precharge. However, if there are one or more pending write transactions within that chain, then the selected_entry write transaction is not tagged with a page closing hint, and is implemented as a normal write at 864. Regardless of whether a page closing hint accompanies the selected_entry, at 868, the address of the selected_entry write transaction is also copied to a latch for storing the address of the selected_entry write transaction as the last_write_selected write transaction for later in use in making associative comparisons, before proceeding back to 812.

At 824, if the associative comparison at 822 did not locate any chains of pending write transactions in the write transaction buffer directed to a different rank and/or bank than the rank and bank of the last_write_selected write transaction, then it may be necessary to incur the delay from waiting for the completion of the closing of the page to which the last_write_selected write transaction was directed, because if any chains do remain, they are necessarily to the same rank and bank, but a different page than that to which the last_write_selected write transaction was directed. At 870, one of those chains of pending write transactions to the same rank and bank, but different page (if there is more than chain one from which to select) is selected, and a pending write transaction making up that chain (if there is more than one pending write transaction within that chain from which to selected) is selected to become the new selected_entry write transaction, and this selected_entry write transaction is removed from that chain. At 872, the count of pending write transactions making up that chain is decremented. A check is made at 880 to determine if there are still other pending write transactions within that chain. If there are no more pending write transactions within that chain (and perhaps, that chain has now ceased to exist or has been otherwise cleared or nullified, as a result of there being no more such pending write transactions), then the selected_entry write transaction is tagged with a page closing hint at 882, possibly resulting in the write transaction being implemented as a write with auto precharge. However, if there are one or more pending write transactions within that chain, then the selected_entry write transaction is not tagged with a page closing hint, and is implemented as a normal write at 884. Regardless of whether a page closing hint accompanies the selected_entry, at 888, the address of the selected_entry write transaction is also copied to a latch for storing the address of the selected_entry write transaction as the last_write_selected write transaction for later in use in making associative comparisons, before proceeding back to 812.

The invention has been described in some detail with regard to various possible embodiments. It is evident that numerous alternatives, modifications, variations and uses will be apparent to those skilled in the art in light of the foregoing description. It will be understood by those skilled in the art that the present invention may be practiced in support of many possible types of memory devices employing any of a number of possible memory technologies. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. A method comprising:
receiving a request for a new write transaction to write data to a memory location within a memory device;
associatively comparing a rank, bank and page of an address to which the requested new write transaction is directed to the rank, bank and page of at least one chain of pending write transactions stored within a CAM;
adding the requested new write transaction to an existing chain of pending write transactions and incrementing a count of pending write transactions within the existing chain if the rank, bank and page of the requested new write transaction matches the rank, bank and page of the pending write transactions within the existing chain; and
creating a new chain of pending write transactions, adding the requested new write transaction to the new chain and setting the count of pending write transactions within the new chain to indicate that the new chain is made up of one pending write transaction if there is no chain of pending write transactions having a rank, bank and page that matches the rank, bank and page of the requested new write transaction.

2. The method of claim 1, further comprising:
storing the address to which a previous selected_entry write transaction was directed as a last_write_selected write transaction to allow another pending write transaction to be selected to become a new selected_entry write transaction;
selecting at least one pending write transaction from a first chain from which the last_write_selected write transaction was selected to become the selected_entry write transaction, removing the selected_entry write transaction from the first chain, decrementing a count of pending write transactions within the first chain, and providing the selected_entry write transaction without a page closing hint to a transaction logic to carry out the selected_entry write transaction if the selected _entry write transaction was not the only write transaction within the first chain;
selecting at least one pending write transaction from a first chain from which the last_write_selected write transaction was selected to become the selected_entry write transaction, removing the selected_entry write transaction from the first chain, decrementing a count of pending write transactions within the first chain, and providing the selected_entry write transaction with a page closing hint to a transaction logic to carry out the selected_entry write transaction if the selected_entry write transaction was the only write transaction within the first chain; and
associatively comparing the rank, bank and page of the last_write_selected write transaction to the rank, bank and page of at least one chain of pending write transactions stored within the CAM, if there are no more pending write transactions within a first chain front which the last_write_selected write transaction was selected, to locate a second chain having of pending write transactions directed to a combination of rank and bank that differ from the combination of rank and bank to which the last_write_selected write transaction was directed.

3. The method of claim 2, further comprising:
selecting at least one pending write transaction from the second chain to become the selected_entry write transaction, removing the selected_entry write transaction from the second chain, decrenienting a count of pending write transactions within the second chain, and providing the selected_entry write transaction without a page closing hint to a transaction logic to carry out the selected_entry write transaction if the selected_entry write transaction was not the only write transaction within the second chain and the second chain having a combination of rank and bank that differs from the combination of rank and bank to which the last_write_selected write transaction was directed was located; and
selecting at least one pending write transaction from the second chain to become the selected_entry write transaction, removing the selected_entry write transaclion from the second chain, decrementirig a count of pending write transactions within the second chain, and providing the selected_entry write transaction with a page closing hint to a transaction logic to carry out the selected_entry write transaction if the selected_entry write transaction was the only write transaction within the second chain and the second chain having a combination of rank and bank that differs front the combination of rank and bank to which the last_write_selected write transaction was directed was located.

4. The method of claim 3, further comprising:
selecting at least one pending write transaction from a third chain to become the selected_entry write transaction, removing the selected_entry write transaction from the third chain, decremenling a count of pending write transactions within the third chain, and providing the selected_entry write transaction without a page closing hint to a transaction logic to carry out the selected_entry write transaction if the selected_entry write transaction was not the only write transaction within the third chain and the second chain having a combination of rank and bank that differs from the combination of rank and bank to which the last_write_selected write transaction was directed was not located; and
selecting at least one pending write transaction from the third chain to become the selected_entry write transaction, removing the selected_entry write transaction from the third chain, decrementing a count of pending write transactions within the third chain, and providing the selected_entry write transaction with a page closing hint to a transaction logic to carry out the selected_entry write transaction if the selected_entry write transaction was the only write transaction within the third chain and the second chain having a combination of rank and bank that differs from the combination of rank and bank to which the last_write_selected write transaction was directed was not located.

5. The method of claim 4, further comprising:
carrying out a write operation without autoprecharge if a selected_entry write transaction was provided to the transaction logic without a page closing hint; and
carrying out a write operation with autoprecharge if a selected_entry write transaction was provided to the transaction logic with a page closing hint.

* * * * *

UNITED STATES PATENT AND TRADEMARK OFFICE
CERTIFICATE OF CORRECTION

| | | |
|---|---|---|
| PATENT NO. | : 7,386,658 B2 | Page 1 of 1 |
| APPLICATION NO. | : 10/877356 | |
| DATED | : June 10, 2008 | |
| INVENTOR(S) | : Rotithor et al. | |

It is certified that error appears in the above-identified patent and that said Letters Patent is hereby corrected as shown below:

In column 20, at line 17, delete "transaclion" and insert --transaction--.

In column 20, at line 32, delete "decremenling" and insert --decrementing--.

Signed and Sealed this

Sixteenth Day of December, 2008

JON W. DUDAS
*Director of the United States Patent and Trademark Office*